US006768125B2

(12) United States Patent
Platzgummer et al.

(10) Patent No.: US 6,768,125 B2
(45) Date of Patent: Jul. 27, 2004

(54) MASKLESS PARTICLE-BEAM SYSTEM FOR EXPOSING A PATTERN ON A SUBSTRATE

(75) Inventors: Elmar Platzgummer, Vienna (AT); Hans Loeschner, Vienna (AT); Gerhard Stengl, Wernberg (AT); Herbert Vonach, Klosterneuburg (AT); Alfred Chalupka, Vienna (AT); Gertraud Lammer, Vienna (AT); Herbert Buschbeck, Vienna (AT); Robert Nowak, Vienna (AT); Till Windischbauer, Deutsch-Wagram (AT)

(73) Assignee: IMS Nanofabrication, GmbH, Vienna (AT)

( * ) Notice: Subject to any disclaimer, the term of this patent is extended or adjusted under 35 U.S.C. 154(b) by 0 days.

(21) Appl. No.: 10/337,903

(22) Filed: Jan. 8, 2003

(65) Prior Publication Data

US 2003/0155534 A1 Aug. 21, 2003

(30) Foreign Application Priority Data

| Jan. 17, 2002 | (AU) | ............................................ | A 76/2002 |
| Mar. 21, 2002 | (AU) | ............................................ | A 434/202 |

(51) Int. Cl.[7] .............................. H01J 37/06; G21K 5/10
(52) U.S. Cl. .............................. 250/492.22; 250/492.1; 250/492.3
(58) Field of Search .............................. 250/398, 492.2, 250/492.21, 492.22, 492.3, 492.1, 492.23

(56) References Cited

U.S. PATENT DOCUMENTS

| 4,967,088 A | 10/1990 | Stengl et al. |
| 4,985,634 A | 1/1991 | Stengl et al. |

(List continued on next page.)

FOREIGN PATENT DOCUMENTS

| EP | 0 660 371 A2 | 6/1995 |

(List continued on next page.)

OTHER PUBLICATIONS

I.L. Berry, et al.,—"Programmable Aperture Plate For Maskless High-Throughput Nanolithography" *J. Vac. Sci. Technol.,* B 15, pp. 2382–2386.

(List continued on next page.)

*Primary Examiner*—Nikita Wells
*Assistant Examiner*—Christopher M. Kalivoda
(74) *Attorney, Agent, or Firm*—Finnegan Henderson Farabow Garrett & Dunner, L.L.P.

(57) ABSTRACT

A device (102) for defining a pattern, for use in a particle-beam exposure apparatus (100), said device adapted to be irradiated with a beam (lb,pb) of electrically charged particles and let pass the beam only through a plurality of apertures, comprises an aperture array means (203) and a blanking means (202). The aperture array means (203) has a plurality of apertures (21,230) of identical shape defining the shape of beamlets (bm). The blanking means (202) serves to switch off the passage of selected beamlets; it has a plurality of openings (220), each corresponding to a respective aperture (230) of the aperture array means (203) and being provided with a deflection means (221) controllable to deflect particles radiated through the opening off their path (p1) to an absorbing surface within said exposure apparatus (100). The apertures (21) are arranged on the blanking and aperture array means (202,203) within a pattern definition field (pf) being composed of a plurality of staggered lines (p1) of apertures. Each of the lines (p1) comprises alternately first segments (sf) which are free of apertures and second segments (af) which each comprise a number of apertures spaced apart by a row offset (pm), said row offset being a multiple of the width (w) of apertures, the length (A) of said first segments (sf) being greater than the row offset. In front of the blanking means (202) as seen in the direction of the particle beam, a cover means (201) is provided having a plurality of openings (210), each corresponding to a respective opening (230) of the blanking means and having a width (w1) which is smaller than the width (w2) of the openings (220) of the blanking array means.

21 Claims, 13 Drawing Sheets

U.S. PATENT DOCUMENTS

| | | | | | |
|---|---|---|---|---|---|
| 5,260,579 | A | * | 11/1993 | Yasuda et al. | 250/492.2 |
| 5,359,202 | A | * | 10/1994 | Yasuda et al. | 250/492.2 |
| 5,369,282 | A | | 11/1994 | Arai et al. | |
| 5,430,304 | A | * | 7/1995 | Yasuda et al. | 250/492.22 |
| 6,014,200 | A | * | 1/2000 | Sogard et al. | 355/53 |
| 2001/0054690 | A1 | * | 12/2001 | Shimada et al. | 250/306 |

FOREIGN PATENT DOCUMENTS

| | | |
|---|---|---|
| EP | 1 253 619 A2 | 10/2002 |
| GB | 2 339 433 A | 1/2000 |
| GB | 2 367 689 A | 4/2002 |
| JP | 11 274033 | 10/1999 |

OTHER PUBLICATIONS

M. Muraki et al.,—"New Concept for High–Throughput Multielectron Beam Direct Write System" *J. Vac. Sci. Technol.,* B 18(6), pp. 3061–3066.

* cited by examiner

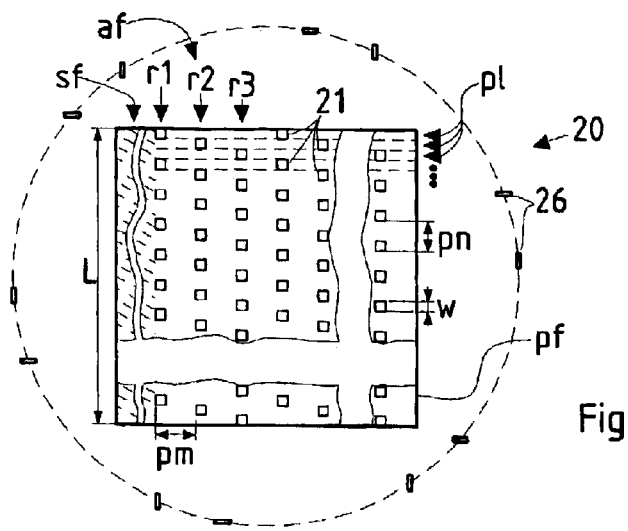
Fig. 2
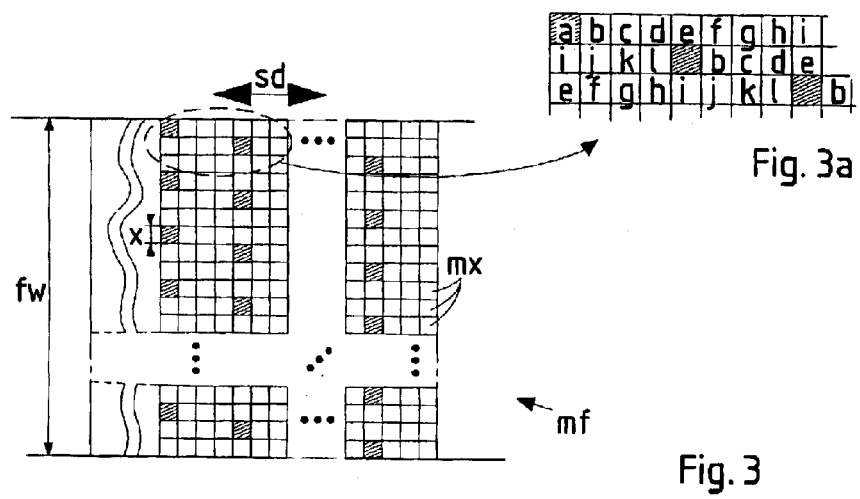
Fig. 3a
Fig. 3
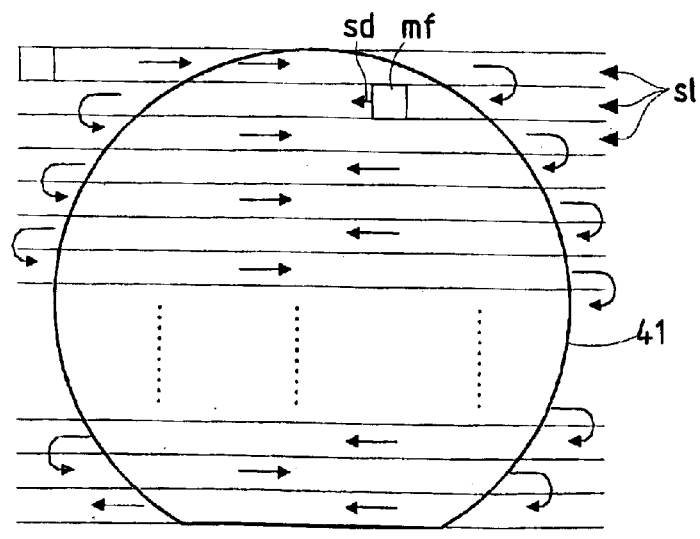
Fig. 4

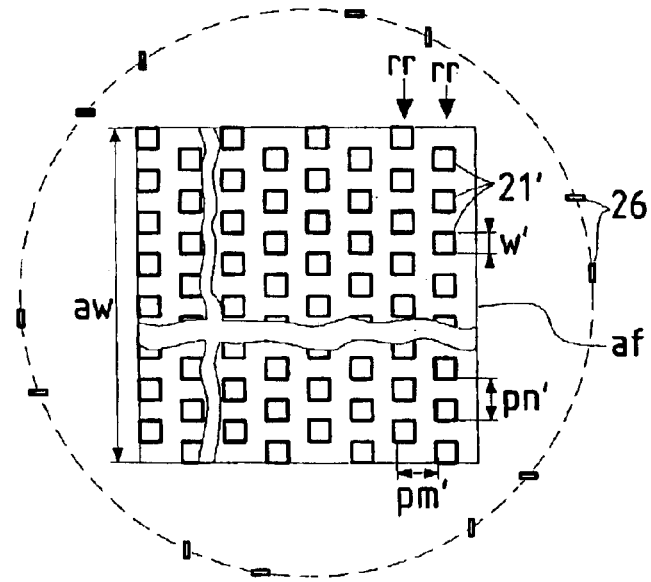
Fig. 15
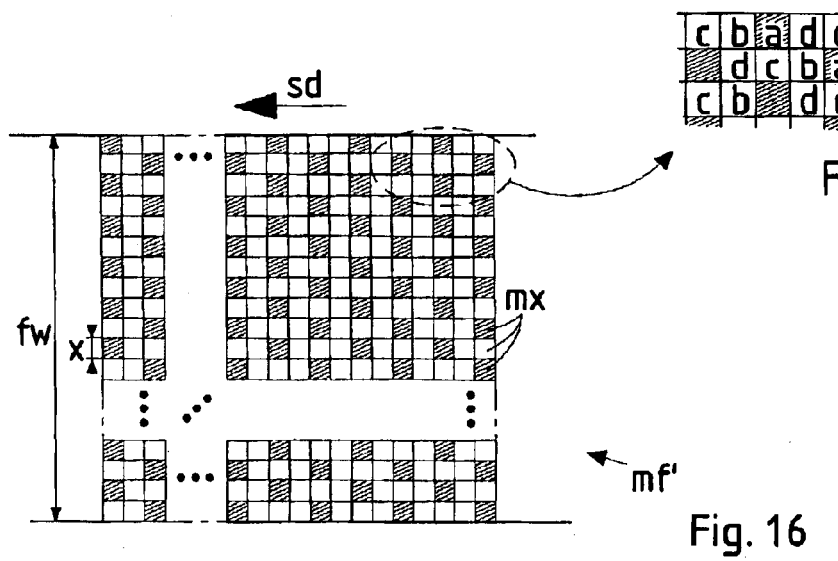
Fig. 16a
Fig. 16

MASKLESS PARTICLE-BEAM SYSTEM FOR EXPOSING A PATTERN ON A SUBSTRATE

FIELD OF THE INVENTION AND DESCRIPTION OF PRIOR ART

The invention relates to a maskless particle-beam exposure apparatus for forming a pattern on a surface of a substrate by means of a beam of energetic electrically charged particles. More in detail, the invention relates to a pattern definition means and an exposure apparatus employing this pattern definition means. In particular, the pattern definition means is a device for defining a pattern in a particle-beam exposure apparatus, which device is adapted to be irradiated with a beam of electrically charged particles and let pass the beam only through a plurality of apertures. It comprises an aperture array means which has a plurality of apertures of identical shape defining the shape of beamlets permeating said apertures, and further a blanking means to switch off the passage of selected beamlets. This blanking means has a plurality of openings, each opening corresponding to a respective aperture of the aperture array means and being provided with a deflection means controllable to deflect particles radiated through the opening off their path to an absorbing surface within said exposure apparatus.

In other words, the particle beam is generated by an illumination system which produces a homocentric or preferentially telecentric beam of energetic particles; this beam illuminates a pattern definition (PD) means having an array of apertures which can be controlled so as to allow ('switched on') or deactivate ('switched off') the passage of particles of the beam through the respective aperture. The beam permeates the blanking aperture array through switched-on apertures, thus forming a patterned particle beam bearing a pattern information as represented by the spatial arrangement of the apertures that are switched on. The patterned beam is then projected by means of a particle-optical projection system onto the substrate where an image of the transparent apertures is thus formed.

One important application of exposure apparatus of this kind is in the field of particle-beam lithography used in semiconductor technology, as a lithography apparatus. In order to define a desired pattern on a substrate surface, such as a circuit layer to be defined on a silicon wafer, the wafer is covered with a layer of a radiation-sensitive photoresist. Then the desired structure is imaged onto the photoresist by means of a lithography apparatus. The photoresist thus patterned is partially removed according to the pattern defined by the previous exposure step, and is now used as a mask for further structuring processes such as etching. By repeating this scheme, complicated minute structures such as an integrated circuits can be formed.

Arai et al., U.S. Pat. No. 5,369,282, discuss an electron-beam exposure system using a so-called blanking aperture array (BAA) which plays the role of the pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area to be exposed on the substrate. In the U.S. Pat. No. 5,369,282, the apertures of every second row align and the pitch between neighboring apertures in a row is twice the width of an aperture; in general, an alignment of rows is possible based on any number n, the pitch then being n times the width of an aperture. The BAA of Arai et al., which is designed for electron radiation only, employs a complicated connection circuitry in order to address the individual apertures. Furthermore, the fact that the beam is moved over the substrate offers problems, such as imaging aberrations, with the electro-optical imaging.

The article of I. L. Berry et al. in J. Vac. Sci. Technol. B15 (1997) pp. 2382–2386, describes a PD device comprising a "programmable aperture array" with an array of 3000×3000 apertures of 5 $\mu$m side length with an n=4 alignment of rows and staggered lines. The aperture array contains additional logic circuitry, thus implementing an electronic mask scanning system in which the pattern information is passed by means of shift registers from one aperture to the next within a row. The article proposes to use a 200× demagnification ion-optical system for imaging the apertures of the BAA onto the substrate, but does not point out how such a demagnification can be achieved.

There are several unresolved issues in the PD/BAA systems of Arai et al. and Berry et al. One of them is the damage done to the aperture array by particle irradiation endangering the lifetime of the array; this is a serious problem as the PD/BAA system contains delicate electronic circuitry. Another serious problem is the severe miniaturizing of the structures on the PD/BAA system, resulting in space scarcity.

SUMMARY OF THE INVENTION

The present invention sets out to overcome the above-mentioned shortcomings of the prior art. In particular, the basic layout of a PD device as proposed by Berry et al. shall be improved in an effective way.

This task is solved according to the invention by a pattern definition means wherein on the blanking and aperture array means, the apertures are arranged within a pattern definition field being composed of a plurality of staggered lines of apertures, wherein each of the lines comprises first segments which are free of apertures and second segments which each comprise a number of apertures spaced apart by a row offset ('aperture fields'); this row offset is a multiple of the width of apertures, while the length of said first segments is greater than the row offset.

The apertures are typically arranged in the pattern definition field in a regular array which, perpendicular to the direction of the lines, repeats itself every n-th line, n$\geq$2. This number can, for instance, be 3 or 4; also a value of 5 may be especially suitable.

In a preferred realization of the invention, the first segments of the lines are positioned adjacent to each other and form a storage field (or possible several storage fields) spanning the width of the pattern definition field. In this case, the lines may be (organizationally) ordered into groups, wherein the first segments of each group are divided along the direction of the lines into logic blocks, each of the logic blocks comprising controlling logic for a second segment of one of the lines of the group situated by the first segment.

Furthermore, the blanking means will preferably comprise buffer means for buffering information to control the deflection means associated with the apertures. These storage means are then located in the areas of the first segments.

A next aspect of the invention relates in particular to the problem to provide a PD system which, while containing a delicate (and thus expensive) circuitry, can stand a long lifetime despite the fact that it is exposed to severe irradiation from the lithography beam. This problem is met by a PD means wherein in front of the blanking means as seen in the direction of the particle beam, a cover means is provided having a plurality of openings, and each opening corresponds to a respective opening of the blanking means, the width of the openings of the cover means being smaller than the width of the openings of the blanking array means. The introduction of such a cover means removes the problem of irradiation of the blanking device but does not impede the definition of the patterned beam, in particular with respect to the shape of the beamlets and control of the pattern.

Preferably the cover means is realized as a unit other than the aperture array means. Furthermore, the aperture array means is preferably positioned after the blanking means as seen in the direction of the particle beam, and the absorbing surface (to which a beam is directed when it is deflected off its path) may be realized by a surface of the aperture array means.

In order to introduce an ion-optical correction individual to the beamlets, the aperture array means may be an aperture plate of varying thickness adapted to act as correction lenses with varying strength upon beamlets defined by the apertures. Alternatively, the aperture array means may be an aperture plate in which after each aperture an opening space is provided, said opening spaces adapted to act as correction lenses upon the respective beamlets defined by the respective apertures, said opening space further having varying width defining varying correction lens strength upon beamlets defined by the apertures.

In another advantageous variant, the aperture array means may be positioned in front of the blanking means as seen in the direction of the particle beam, and the absorbing surface is then realized by a stop plate positioned after the pattern definition means.

In a further development of the invention, the PD means further comprises a correction lens means positioned after the blanking means; such a correction lens means is, for instance useful to correct for optical defects such as a curvature of the image field. This correction lens means comprises an array of electrostatic lenses, each of said lenses acting on a beamlet projected through an opening of the blanking means. The correction lens means may be positioned after both the blanking means and the aperture array means.

A further aspect of the invention deals, in particular, with the problem of realizing a system which combines the need to produce structures of very small feature size dimensions on the substrate with the desire to provide the PD means with a complex circuitry which needs a minimum amount of space. This problem, which appears in particular in an exposure system also having a substrate holder means adapted to continuously move the substrate laterally across the patterned particle beam to expose different parts of the substrate to the patterned particle beam, and a controlling means to control switching off of apertures selected in accordance with a desired image to be produced on said substrate and the continuous motion of the substrate, is overcome by providing the projection system such that it comprises at least two consecutive demagnifying projectors, each of said projectors adapted to project the patterned beam through a cross-over into a resulting beam of reduced lateral width, wherein the first of said projectors produces an intermediate image of the transparent apertures, said image being projected by means of the following projector(s) onto said substrate surface. This composite projection system offers a high demagnification—for instance 200× or more—while maintaining a high level of quality of the optical system with regard to optical defects. By distributing the demagnification onto a sequence of projector stages, the total length of the projection system can be decreased substantially.

In the case that, additionally to the composite projector system, the aperture array means is further positioned in front of the blanking means as seen in the direction of the particle beam, and the absorbing surface is realized by a stop plate positioned after the pattern definition means, said stop plate can advantageously be located at the position of the cross-over of the first projector; it then has an opening corresponding to the width of the patterned beam at this position.

Another aspect of the invention addresses imaging problems which may arise from space charge effects, in particular when the amount of current that passes through the PD device varies with time. Such a temporal change of current causes temporally varying blurring and distortion of the image which is distinctly more difficult to deal with as compared to a constant charge-caused blurring. This problem is met by a method for forming a pattern on a surface of a substrate by means of a beam of energetic electrically charged particles, comprising the following steps:

producing said particle beam, illuminating said particle beam through a PD means producing a number of beamlets using an aperture array means having a plurality of regularly arranged apertures of identical shape define the shape of said beamlets, and using a blanking means to switch off the passage of selected beamlets the others forming, as a whole, a patterned particle beam, and projecting said patterned particle beam onto said substrate surface to form an image of those apertures which are switched on, each aperture corresponding to an image element on the substrate surface during the duration of a uniform exposure time, wherein a subset of the apertures is switched on during a fraction of the exposure time and switched off for the remaining fraction of the exposure time, thus causing a fractional exposure at a value lower than a threshold of exposure of image elements on the substrate surface, which threshold is lower than the value corresponding to a full exposure as caused by an aperture switched on during the full exposure time.

This method according to the invention allows for the introduction of additional charge current without the need to change the structure pattern that is produced on the substrate. Apertures switched on only during a fractional time of exposure are included when for a given image pattern the corresponding current would be too low, or the corresponding current density distribution would be too inhomogenous; these apertures do lead to an irradiation of the corresponding image elements on the substrate, but not to an effective exposure as the dose of irradiation is below the threshold of exposure.

In order to level the current, it is advantageous when the number of switched-on apertures is kept constant during each fraction of exposure time, for instance by selecting an appropriate number of apertures for a fractional exposure of image elements below said threshold of exposure. In this case, it is further advantageous if the plurality of apertures is divided into groups according to a division of the area occupied by the apertures into a multitude of sub-fields, and within each group of apertures corresponding to a sub-field the number of switched-on apertures is kept constant at a set level which is uniform over these groups. Preferably, an aperture array means is used whose apertures cover 1/N of the area having apertures (i.e., the aperture fields), where N is an integer, corresponding to the row offset mentioned above divided by the width of an aperture. A relative motion between the substrate and the patterned particle beam is provided, resulting in an effective motion of the patterned particle beam over the substrate surface, the beamlets being effectively moved over a sequence of adjacent image elements on the substrate surface, wherein the image elements exposed in N subsequent positions of the patterned particle beam form a contiguous covering of a target field on the substrate.

In particular in combination with a system where the substrate is moved continuously during exposure it is suitable when the projection system comprises a deflection system, by means of which the position of the image is continuously adjusted on the substrate surface laterally in correspondence with the continuous motion of the substrate, in order to obtain a better definition of the imaged pixels. The deflection system may advantageously be adapted to adjust the position of the image according to a saw-tooth-like motion; thus, during the continuous parts (slopes) of the saw-tooth the position of the image is adjusted in a manner to hold its position relative to the substrate surface on a position of a respective target field on the substrate.

BRIEF DESCRIPTION OF THE DRAWINGS

In the following, the present invention is described in more detail with reference to a preferred embodiment illustrated in the drawings, which schematically show:

FIG. 2 a plan view of the aperture arrangement in a pattern definition device of the lithography apparatus of FIG. 1;

FIG. 3 an image field as present on a substrate surface;

FIG. 4 the motion of the image field of FIG. 3 on a wafer substrate to be exposed;

FIG. 15 a plan view of an aperture arrangement of a variant pattern definition device;

FIG. 16 the image field corresponding to the arrangement of FIG. 15;

DETAILED DESCRIPTION OF THE INVENTION

Figure 1:
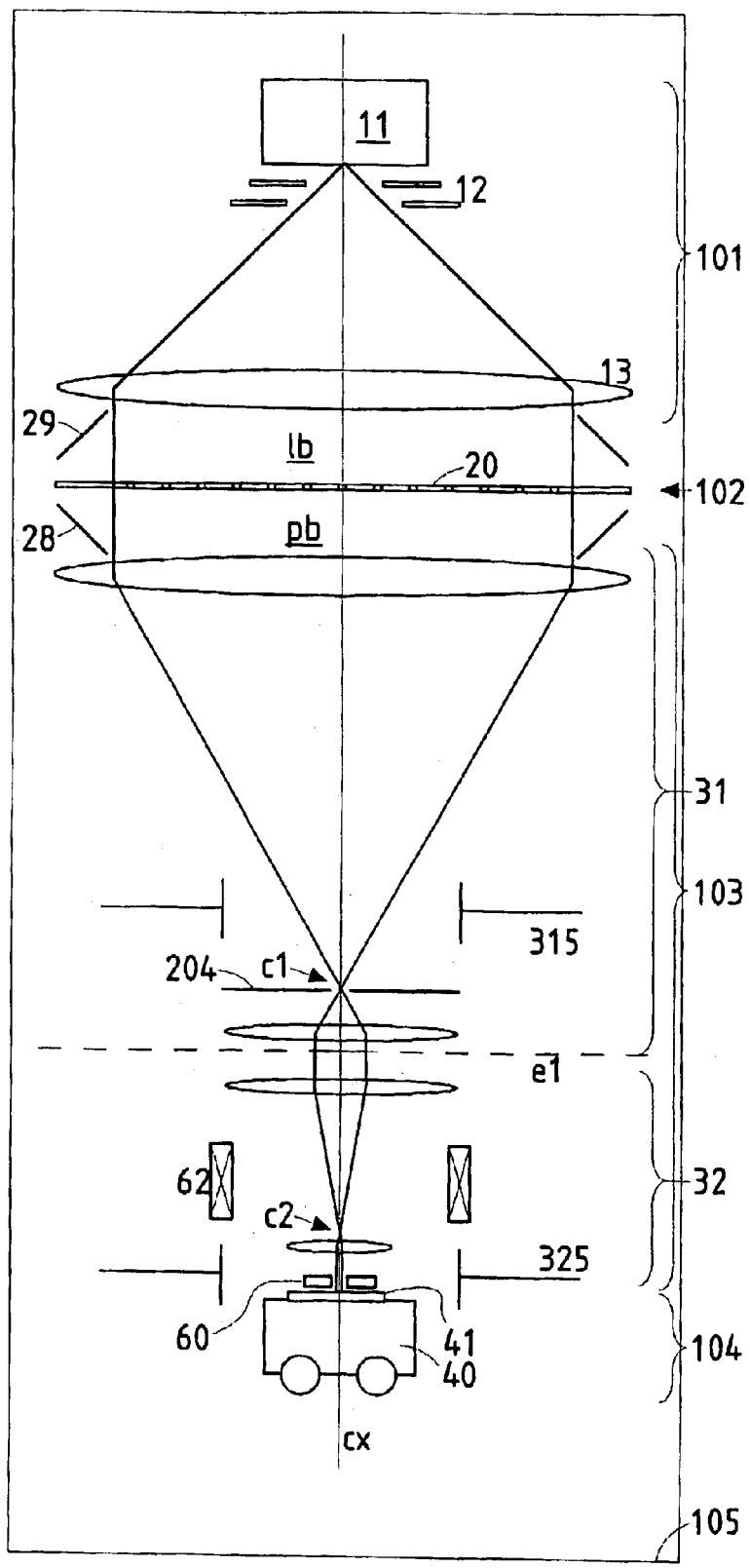
FIG. 1 in a longitudinal section a layout of a lithography apparatus according to the invention.

An overview of a lithographic apparatus according to a preferred embodiment of the invention is shown in FIG. 1. In the following, only those details are given as needed to disclose the invention; for the sake of clarity, the components are not shown to size in FIG. 1. The main components of the lithography apparatus 100 are—corresponding to the direction of the lithography beam lb,pb which runs vertically downward in FIG. 1—an illumination system 101, a pattern definition (PD) system 102, a projecting system 103, and a target station 104 with the substrate 41. The whole apparatus 100 is contained in a vacuum housing 105 held at high vacuum to ensure an unimpeded propagation of the beam lb,pb along the optical axis cx of the apparatus. In the embodiment shown, the particle-optical systems 101,103 are largely realized using electrostatic lenses; it should be noted that other implementations, such as electromagnetic lenses may be used as well.

The illumination system comprises an ion source 11 fed by a gas supply (not shown) and an extraction system 12. In one embodiment, helium ions ($He^+$) are used; it should, however, be noted that in general other electrically charged particles can be used as well. Apart from electrons (emitted from an electron gun) these can be, for instance, hydrogen ions or heavy ions; in the context of this disclosure heavy ions refer to ions of elements heavier than C, such as O, N, or the noble gases Ne, Ar, Kr, Xe.

The ion source 11 emits energetic ions, i.e., having a defined (kinetic) energy of typically several keV, e.g. 10 keV. By means of an electro-optical condenser lens system 13, the ions emitted from the source 11 are formed into a wide, substantially telecentric ion beam serving as lithography beam lb. The lithography beam lb then irradiates a PD device 20 which, together with the devices needed to keep its position (see below, FIGS. 9 and 10 below), form the PD system 102. The PD device 20 is held at a specific position in the path of the lithography beam lb, which thus irradiates a plurality of apertures 21 (see FIG. 2). Some of the apertures are "switched on" or "open" so as to be transparent to the incident beam; the other apertures are "switched off" or "closed", i.e. non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (in FIG. 1, below the device 20).

The pattern as represented by the patterned beam pb is then projected by means of an electro-optical projection system 103 onto the substrate 41 where it forms an image of the switched-on mask apertures 21. This is in contrast to, e.g., Arai et al., where rather than the apertures, images of the particle source are formed on the substrate. The projection system 103 implements a demagnification of, for instance, 200× with two crossovers c1,c2. The substrate 41 is, for instance, a silicon wafer covered with a photo-resist layer. The wafer 41 is held and positioned by a wafer stage 40 of the target station 104.

The apparatus 100 further comprises an alignment system 60, which allows to stabilize the position of the image of the mask apertures (image field mf, FIG. 3) on the substrate with respect to the ion-optical system by means of reference beams which are formed in the PD system by reference marks 26 at the side of the PD field pf (FIG. 2); the principles of a alignment system are described in the U.S. Pat. No. 4,967,088. The alignment system can furthermore ensure compensation for image placement errors which are due to deviations in the stage movement, using a real-time feedback controller in conjunction with a multipole pattern correction. For instance, correction of image position and distortion can be done by means of a multipole electrode 315,325; additionally, a magnetic coil 62 can be used to generate a rotation of the pattern in the substrate plane.

In the embodiment of the invention shown in FIG. 1, the projection system 103 is composed of two consecutive electro-optical projector stages 31,32. The electrostatic lenses used to realize the projectors 31,32 are shown in FIG. 1 in symbolic form only as technical realizations of electrostatic imaging systems are well known in the prior art, such as, for instance, the U.S. Pat. No. 4,985,634 (=EP 0 344 646) of the applicant. The first projector stage 31 images the plane of the apertures of the device 20 into an intermediate plane e1 which in turn is imaged onto the substrate surface by means of the second projector stage 32. In the intermediate plane e1 the beam is substantially telecentric as it is at the position of the PD device. Both stages 31,32 employ a demagnifying imaging through crossovers c1,c2; thus, while the intermediate image in the plane e1 is inverted, the final image produced on the substrate is upright (non-inverted). The demagnification factor is about 14× for both stages, resulting in an overall demagnification of 200×. A demagnification of this order is in particular suitable with a lithography setup, in order to elevate problems of miniaturization in the PD device.

After the first stage 31 the beam width is well reduced—for instance, from an initial width of the PD field pf (FIG. 2) of L=60 mm to about 4 mm at the intermediate plane e1. As a consequence, since the dimensions of the electro-optical components of the second stage 32 need not be reduced to the same scale as the beam width, the lens elements can be realized larger with respect to the beam, which allows for an easier treatment of lens defects and imaging aberrations. For example, with a total source-substrate length of about 2 m, the focal length of the final lens after the second stage crossover c2 can be as small as about 20 mm. This allows for high ion currents that can be treated, for instance of the order of 4 to 10 $\mu A$, because space charge correlation have only little influence.

In both projector stages the respective lens system is well compensated with respect to chromatic and geometric aberrations; furthermore, a residual chromatic aberration of the first stage 31 can be compensated by suitable fine correction of the electrode potentials in the second stage 32. By virtue of the chromatic compensation, the energy of the ions (or in general, charged particles) emitted from the source 11 are allowed to have a comparatively high energy blur of up to $\Delta E=6$ eV. This allows to use sources with less stringent requirements for quality and, therefore, emitting higher currents.

Furthermore, the effect of stochastic errors, which are due to particle interactions mainly in the crossovers c1,c2, is reduced as the stochastic errors of the first stage are demagnified in the second stage, and stochastic errors in the second stage have little influence due to the small distance of the second crossover c2 from the substrate plane.

As a means to shift the image laterally, i.e. along a direction perpendicular to the optical axis cx, deflection means 315,325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the alignment system.

FIG. 2 shows a plan view of the arrangement of apertures in the PD device 20. A plurality of square-shaped apertures 21 is provided which are arranged within a PD field pf in a regular array in which the apertures 21 are aligned along adjacent lines p1, wherein in each of the lines p1 the same number of apertures is present. Seen along the direction perpendicular to the lines p1, the apertures form a sequence of rows r1,r2,r3; in the embodiment shown, the rows r1–r3 are not adjacent but spaced apart. The apertures are arranged in aperture fields af according to a skewed regular arrangement in a like manner as with the U.S. Pat. No. 5,369,282, however with the row and line offsets having different values: The apertures of every third row align (n=3) as the pitch pn between neighboring rows is three times the width w of an aperture (i.e., pn=n×w), and the offset pm between neighboring rows is 4 times the width of an aperture (i.e., pm=m×w with m=4). Within a line p1, the offset of apertures is n·pm=12. Thus, the apertures cover only $1/(n\times m)=1/12$ of the area of the field pf and, at a time, only one out of n×m=12 image elements can be exposed as shown in FIG. 3; the other elements are exposed in subsequent steps by means of moving the substrate along the "scanning direction" sd relative to the image of the apertures. The spatial arrangement of the apertures 21 and the layout of circuitry to control the apertures is discussed in detail with reference to FIGS. 9 to 13.

FIG. 3 illustrates the image field mf produced on the substrate; for the sake of clarity it is assumed that all apertures are switched on in this figure. The width fw of the image field is the width L of the PD field pf reduced by the demagnification factor of the projection system.

The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 3) can be exposed at a time. In order to expose also the other image elements, the substrate is moved under the beam so as to shift the image field on the substrate. FIG. 3a illustrates the exposure of pixels in subsequent positions of the motion of the substrate through the possible 12 (=n×m) positions; the pixels are accordingly referenced with letters a to l (the pixels shown hatched are position a). The whole image field mf is moved over the surface of the photoresist-covered wafer serving as substrate 41 so as to cover the total area of the substrate surface. As shown in FIG. 4, in order to minimize the path length of the movement, the scanning direction sd alternates from one scan line sl to the next (boustro-phedonal motion).

Beside the use as electronic alignment and alignment device, the deflection means 315,325 can be used to compensate the lateral smearing of the pixels in the scanning direction sd which would occur during the writing process on the substrate by the "write on the fly" technique. For this, a periodic electrostatic field—preferably, having a saw-tooth profile—with a frequency equal to the toggling frequency of the blanking means (FIGS. 11–13) of the PD device 20 is applied.

The ion beam pb is held substantially in place during the writing procedure while the substrate is moved beneath it. According to the invention it is proposed that the deflection system 315,325 adjusts the position of the image according to a saw-tooth motion. During the time of exposure of a pixel, the image of the apertures are deflected so as to follow the motion of a pixel, thus the aperture images stay steady on the respective pixels or equivalently, the image of the aperture array holds its position relative to the substrate surface on a position of the respective target field. This corresponds to continuous parts of the saw-tooth; between these continuous parts, the saw-tooth "Jumps back" to redirect the image to the position of the next frame of a target field which, by then, has taken the position of the original frame.

In the example discussed here, the minimum feature size shall be 50 nm, and the smallest spot to be illuminated on the wafer, here defined as the pixel width x, is 25 nm. The image field width fw is 300 $\mu$m; in order to produce this image field in connection with a 200× demagnification projection system (see above), the square-shaped PD field has a width L=60 mm. Consequently the number of lines p1 is L/w= 12000, and 12000 bit streams are to be addressed by the incoming data stream. In the direction across, there are fw/(n·x)=L/(n·w)=4000 apertures in each of the rows r1–r3. Since only ¾ of the area of the lines p1 is actually used for apertures (as further explained with FIG. 9ff below), the number of apertures in each line p1 is (¾)·L/(n·pm)=750. Thus, the PD field comprises 3×4000×750=9.10$^6$ apertures of width and length w=5 $\mu$m.

Assuming 12 $\mu$C/cm$^2$ resist sensitivity, 40 MHz clock rate and 144 $\mu$A total current impinging on the PD device, a scanning speed of 1 m/s follows. This value corresponds to a wafer throughput of 13.6 wafers (of 300 mm size) per hour, each wafer consisting of 913 scan lines (80 s inactive time assumed for wafer change and alignment time). The current $I_A$ that passes through a switched-on aperture is approximately 1 pA, and produces a current density on the wafer of 0.16 A/cm$^2$. The 'full pixel dose' of 12 $\mu$C/cm$^2$ is then reached after 75 $\mu$s exposure time (sum over the 3000 apertures along the scan line). The duration $t_A$ of a single exposure of one pixel (also see the discussion below) is 25 ns. The data rate necessary is 12000 pixels×40 MHz=480 GHz.

It should be noted that the parameters n, m, w etc. used in the example of the PD field pf illustrated in FIGS. 2 to 4 can also take other respective values instead of those described above. In particular, the row alignment count n and the pixel repeat count m need not be equal and can, respectively, also take values greater than 2, e.g., 3, 4, 6, 8, 10 or 16. The number of pixels in an image field column is determined by the ratio of the image field width fw over the pixel width x of a pixel mx; the latter dimension is, in turn, determined from the desired minimum feature size.

Figure 5A:
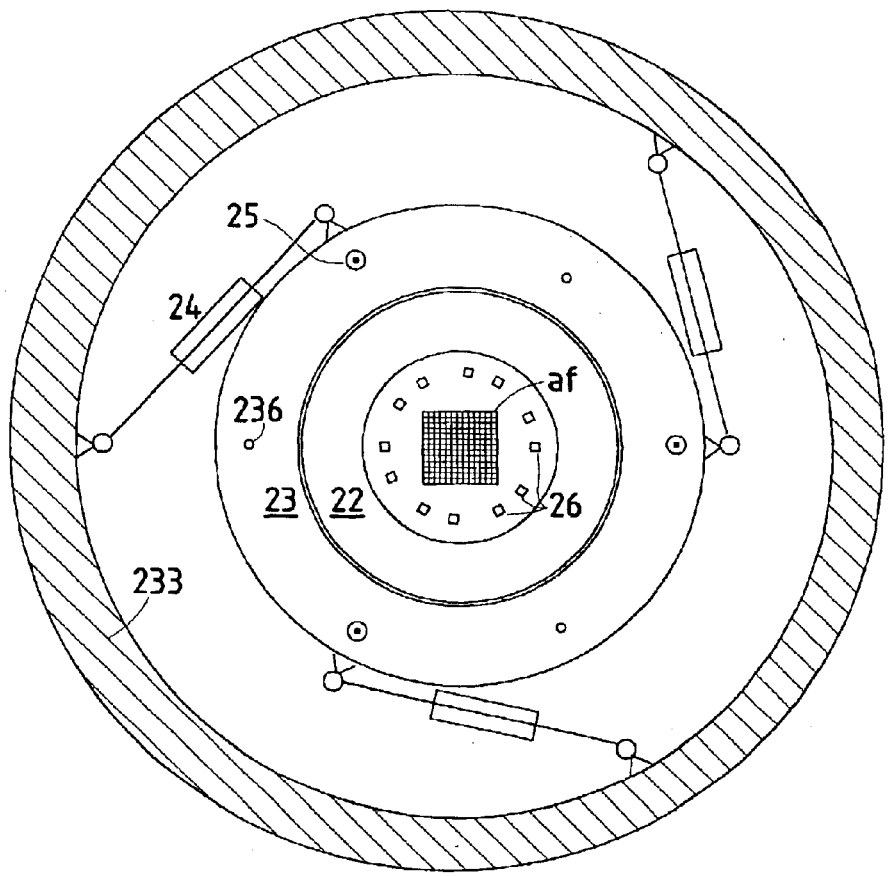
FIG. 5 the pattern definition device in a top view (FIG. 5a) and a longitudinal section (FIG. 5b)
Figure 5B:
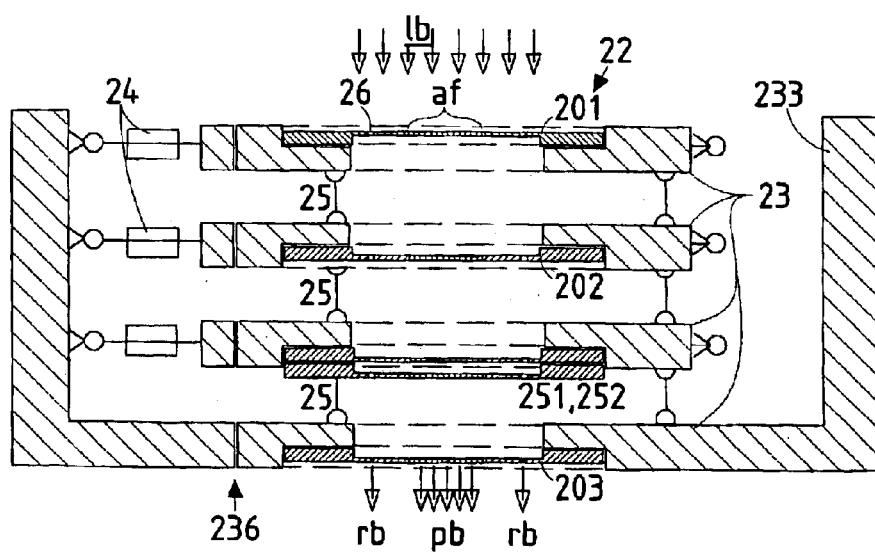
Figure 6:
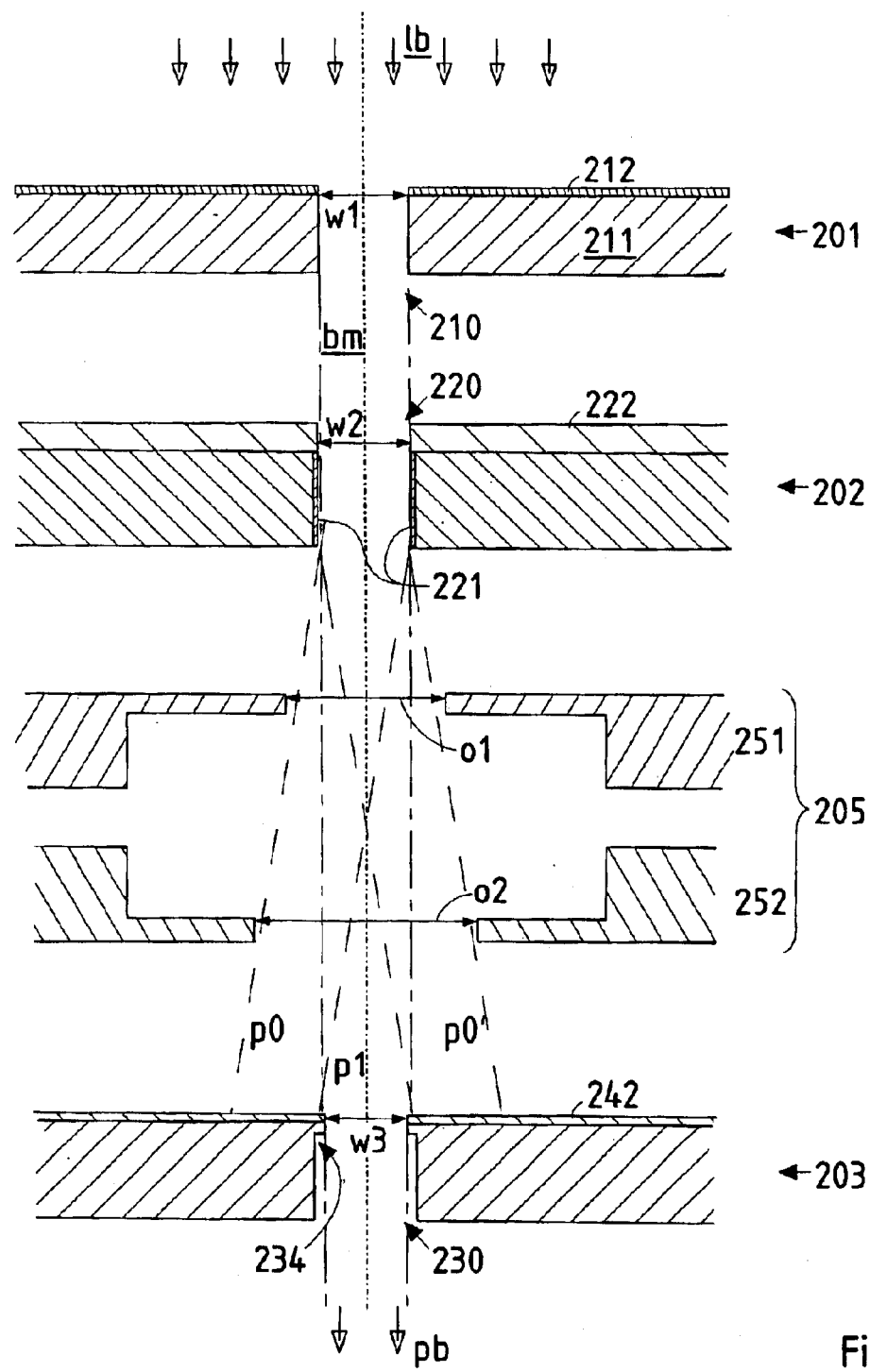
FIG. 6 a detail of FIG. 5b showing the details of an aperture.

FIG. 5 shows the PD system 102 of the apparatus 100, namely, in FIG. 5a a top view and in FIG. 5b a cross-sectional view. FIG. 6 shows the configuration of one single aperture of the PD system 102 in detail. The system 102 comprises a number of plates 22 mounted in a stacked configuration. The PD system 102 according to the invention is realized as a composite device whose components serve respective functions. Each of the plates 22 is realized as a semiconductor (in particular silicon) wafer in which the structures were formed by micro-structuring techniques known in the art. The lithography beam traverses the plates through an array of apertures in the PD field pf (FIG. 5). Each aperture corresponds to a set of openings 210,220,230 which are defined in the plates 22 (FIG. 6).

The thickness of each of the plates 22 is about 100 $\mu$m; their mutual distance is in the order of 100 $\mu$m to 1 mm. It might be convenient to increase the thickness of the blanking plate to, e.g. 2 mm, to improve the thermal conductivity and thus favor the dissipation of the heat produced by the integrated circuit by cooling the margin. It should be noted that in FIGS. 5b and 6, the dimensions in the longitudinal axis (z-axis parallel to the optical axis of the apparatus) are enlarged and not to size.

The blanking of the beamlets is controlled by means of a blanking means realized as a blanking plate 202 which comprises an array of openings 220, each corresponding to an aperture, in a blanking field bf. Each opening 220 comprises a set of beam blanking electrodes 221 as well as the circuitry 222 for controlling the electrodes 221, which are accommodated, for instance, in the upper surface layer of the blanking plate 202. The blanking electrodes 221, serving as aperture deflection plates as described below, are formed in the blanking openings by perpendicular growth employing state-of-the-art techniques.

In front of the blanking plate 202, as seen in the direction of the lithography beam, a cover means realized as a cover plate 201 is provided in order to protect the blanking plate 202, in particular the circuitry 222, from irradiation damage. The cover plate 201 takes up the majority of the impingent lithography beam lb; the particles can only pass through the openings 210, formed in an array corresponding to that of the blanking plate, which openings make up only a small fraction of the total area of the blanking field bf. For instance, with an irradiation density of 4 $\mu$A/cm$^2$ of helium ions of 10 keV, the heat load to the cover plate is approximately 40 mW/cm$^2$. This heat input is compensated by thermal radiation from its surface (in conjunction with cooling elements 29 located in front of the PD system, cf. FIG. 1) and by heat flow through the bulk material 211, e.g. silicon, of the cover plate whose thickness is chosen sufficiently large to ensure cooling by heat conduction, e.g. at least 50 $\mu$m. Advantageously, the cover plate 201 is provided with a protection layer 212 of a material of high resistance against the particle radiation used, such as a metal or—in particular for helium ions—a carbon layer. The cover plate 201, which itself can be produced with comparatively low requirements on the accuracy of its openings and easily replaced, eliminates an irradiation load on the blanking plate 202, which is substantially more expensive due to its complex circuitry.

The width w2 of the opening 220 in the blanking plate 202 is greater than the width w1 of the opening 210 in the cover plate 201, so the beamlet bm. defined by the latter opening will pass through the former opening without affecting the controlling circuitry 222 on the blanking plate 202. For instance, the width w2 can be 7 $\mu$m (as compared to the defining width of the aperture of w=5 $\mu$m), with a height-to-width ratio of the blanking electrodes of 1:2.7.

The PD system 102 further comprises an aperture array means which serves to define the beamlet laterally and which is here realized as a final aperture plate 203 with an array of openings having a width w3. Thus, it is the aperture 230 of width w3 (rather than the initial opening in the cover plate 201) which defines the lateral shape of the beamlet emerging from the system 102 (corresponding to the width w of an aperture in FIG. 2). Therefore, in the discussion referring to FIGS. 5 to 8, the term 'apertures' is reserved to the openings of defined shape and width w (FIG. 2) as defined by the beamlet-defining apertures 230, in contrast to 'opening' which is used as generic term. In order to ensure a high accuracy of the lateral definition of the beamlet, the opening has retrograde edges 234. To enhance the lifetime of the final plate, it is further covered with a protective layer 242, for instance a layer using a metal suitable as ion-resistant material. The aperture plate is cooled by thermal radiation from cooling elements 28 (FIG. 1) provided after the PD system 102, e.g. using a cooled electrode of the first projector stage provided with a cooled surface having a high thermal emissivity close to 1. The beamlet bm transgresses the subsequent openings of the plates 22 along the path p1 provided the blanking electrodes 221 are not energized; this corresponds to the "switched-on" state of the aperture. A "switched-off" aperture is realized by energizing the electrodes, applying a transverse voltage. In this state, the blanking electrodes 221 deflect the beamlet bm off the path p1 so the beamlet cannot pass through the final aperture in the plate 203 but is absorbed instead at a position at the side of the aperture 230.

Preferably, for consecutive apertures along the scanning direction the beamlet is deflected to opposite directions p0,p0' alternatively; this measure is useful as the switching time between the directions p1 (switched-on state of the aperture) and p0,p0' (switched-off) will take a finite time, and alternating the switch-off paths p0,p0' will prevent that one side of the imaged pixel is exposed stronger than the other.

As can be seen from FIG. 5b, the cover plate 201 and the aperture plate 203 are, respectively, the first and the last of the plates 22 of the PD device. This is a remarkable feature as it is only these two plates that come into contact with the radiation of the lithography beam. Therefore, only these two plates will have to be replaced at periodic intervals whereas for the other plates a provision of replacement is not necessary.

In a variant, the functions of the cover plate and the aperture plate may be combined into one plate which is positioned as a first plate of the PD device, having apertures defining the shape of the beamlets. Preferably, however, the apertures defining the shape of the beamlets are positioned on a device separate from the cover plate. For, it should be kept in mind that the radiation load caused by the impinging particles can cause substantial distortions due to radiation-induced thermal and structural changes, and the provision of a separate cover plate will substantially reduce the effect of these distortions to the aperture plate.

As another advantage of the invention, the distance between the blanking plate 202 and the aperture plate 203 can be large, for instance 1 mm or more. As the voltage applied to the blanking electrodes 221 can be the lower the larger the distance to the aperture plate 203 is chosen (since this lowers the required angle of deflection from the path p1), a large blanking-aperture distance helps to alleviate insulation and cross-talk problems with the blanking electrode control.

In front of the aperture plate 203 an additional stop plate (not shown) may be provided in which then the absorption of the deflected beamlet takes place. The width of the opening in the stop plate will be greater than the aperture width so as to not impede the definition of the beamlet. In a like manner of the cover plate 201 protecting the blanking plate 202, such a stop plate with low requirements on the accuracy of its openings serves to keep low the level of radiation impinging on the aperture plate 203.

Figure 7:
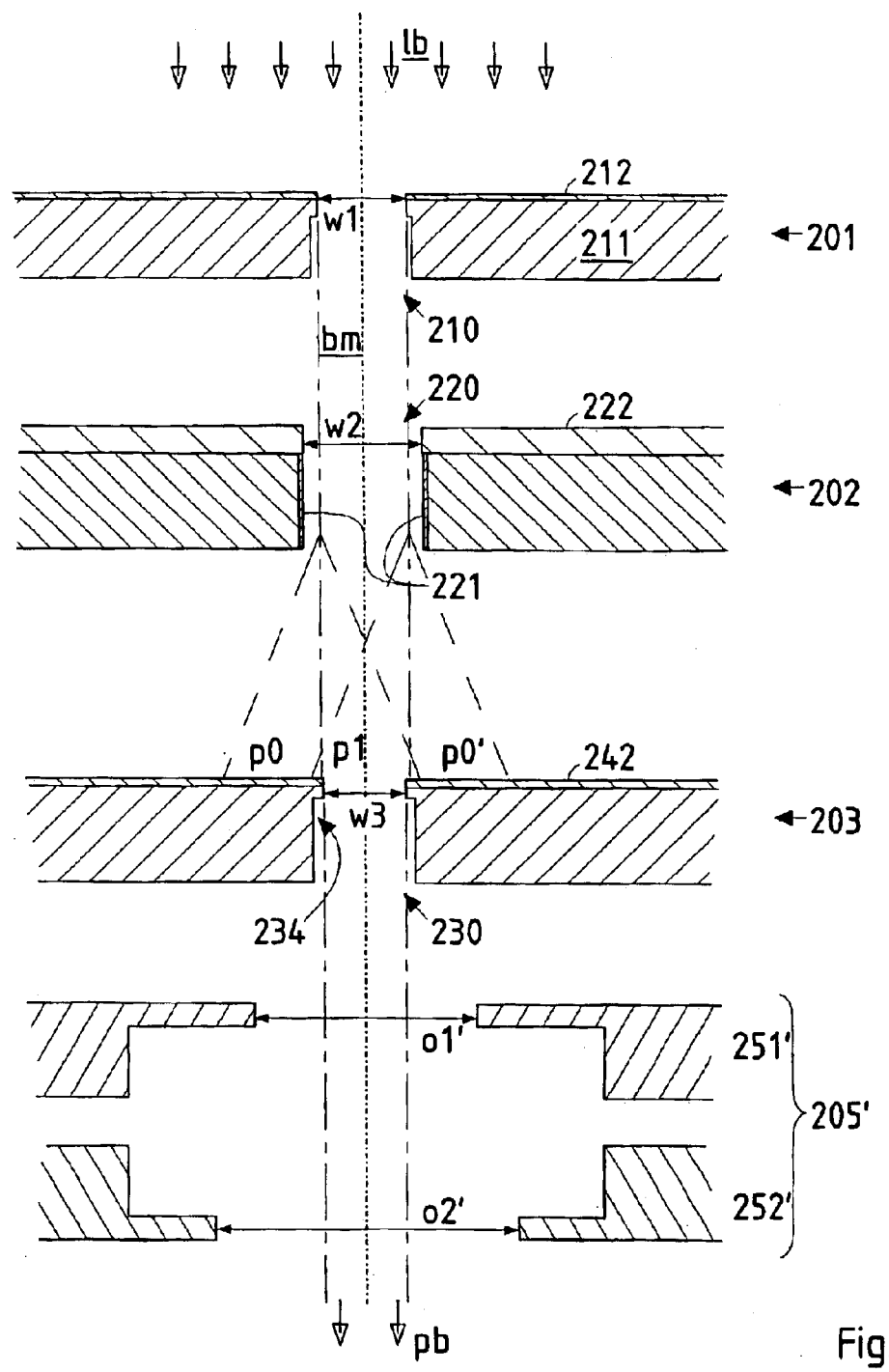
FIGS. 7 and 8 two variants of the pattern definition device in a like view as in FIG. 5.

The PD system 102 may further comprise a correction lens means 205 for correction of geometric aberrations of the projection system. The correction lens means may be situated in front of or after the aperture plate 203, as illustrated in FIGS. 6 and 7, respectively, where it is realized as a sequence of plates 251,252 which each have an array of openings corresponding to the aperture array. In the embodiment shown, different electric potentials are applied to the plates 251,252; preferably, the plate 252 is held on the same electric potential as the aperture plate 203 so as to realize an Einzel lens for each beamlet. The widths o1,o2 of the openings is adapted to build a correction lens of predetermined focus. Suitably, the widths o1,o2 may vary across the device depending on the lateral position of the corresponding apertures. Thus, a correction lens array is formed which can, e.g., be used to correct the field curvature of the image in a like manner as described in M. Muraki et al., J. Vac. Sci. Technol. B18(6), 3061–3066. Since the plates are connected to different electric potentials, they must be isolated from each other, for instance by means of an insulating oxide layer on one of the wafers realizing the plates 251,252. The number of correction plates can also be higher than two; on the other hand, also a single correction plate may be provided which realizes a field lens in conjunction with a neighboring plate of the PD system, preferably the aperture plate 203.

The correction lens 205 array may be situated in front of the aperture plate 203 as shown in FIG. 6. In this case it locally changes the angle of incidence of the particles onto the aperture. Alternatively, as shown in FIG. 7, a corrections lens array 205' may be positioned after the aperture plate 203, in which case the lens array 205' can be used to shift the focusing length of the optical system. With either implementation 205,205' it is possible to counteract the increase in size at the image plane of a pixel due to the field curvature.

Figure 8:
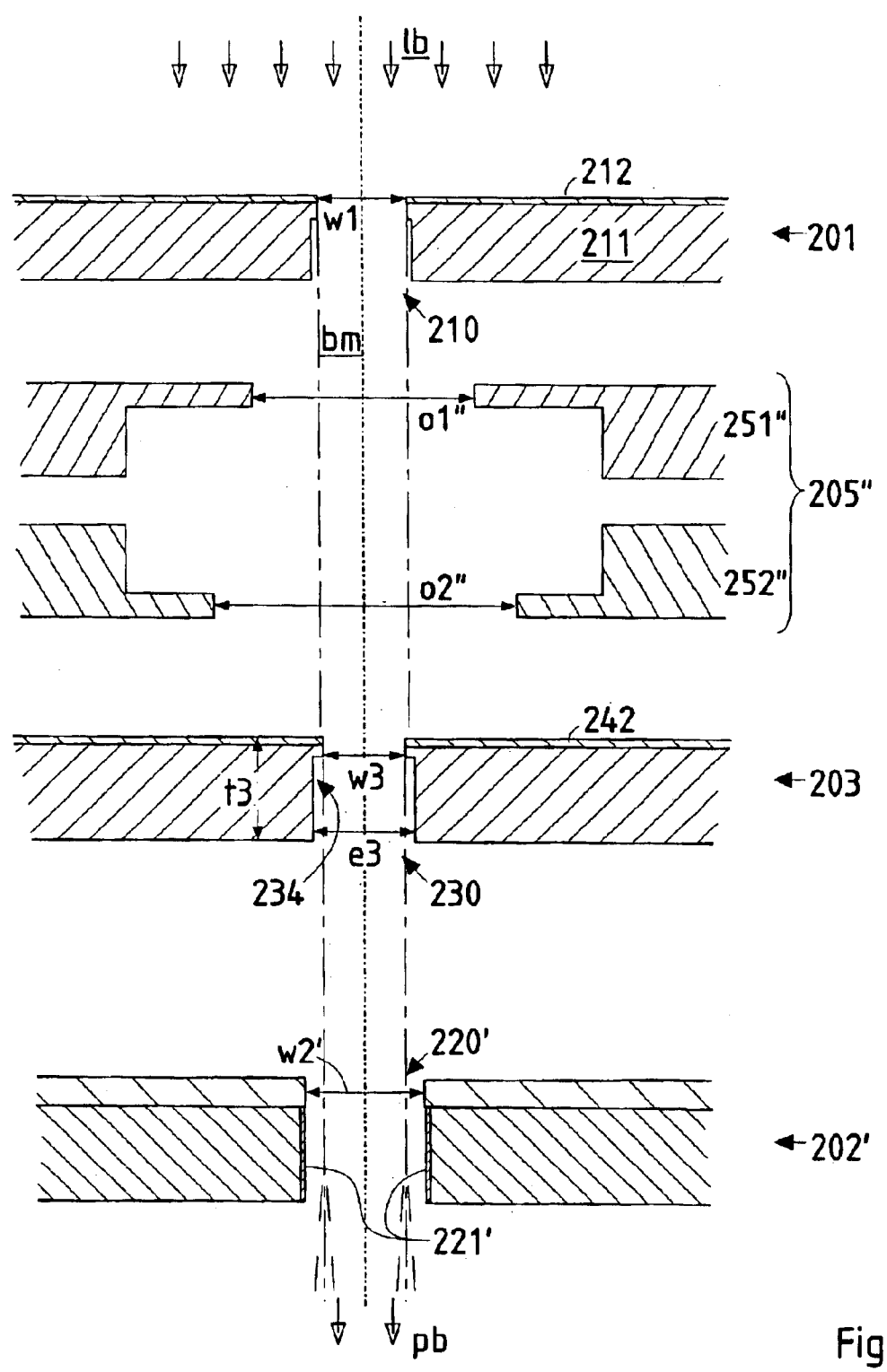

A correction effect may also be introduced by exploiting the geometric shape of the opening forming the aperture 230 in the aperture plate 203. If, from the first lens of the projection system, an electric field is realized below the aperture plate 203, the space in and below each aperture 230 will have a lens effect (so-called "aperture lens"). Referring to FIG. 8, this lens effect can be spatially modulated by variation of the thickness t3 of the bulk membrane of the plate 203 or by variation of the width e3 of the opening below the aperture 230, for instance by means of control of the retrograde edges 234.

Another variant of the arrangement of component plates is illustrated in FIG. 8, in which the blanking plate 202' is positioned after the aperture plate 203, as seen in the directing of the beam. The blanking electrodes 221' thus deflect the beamlet already defined by the aperture 230. If a beamlet is deflected off its switched-on path, it is absorbed in a stop plate 204 (FIG. 1) which is provided after the aperture plate 203 and can be positioned even at a considerable distance to the actual PD device, for instance, near the first crossover c1. It should be appreciated that stop plates provided around a crossover are known from prior art in order to delimit the patterned beam pb and fend off erratic radiation; in this variant of the invention, the stop plate takes over the additional task of absorbing those beamlets which are deflected from their standard path p1 when the corresponding apertures are "switched off", and only allows passage of the undeflected beamlets bundled in the crossover c1 through an opening of a diameter of, e.g., 2 mm. It is noteworthy that, although this somewhat delayed removal of the deflected beams causes an inhomogeneous space charge, this will be negligible since in the range near to the crossover c1, the deflected beamlets are sufficiently far away from the undeflected patterned beam. Certainly, in an variant embodiment of the arrangement shown in FIG. 8, a stopping plate could be realized by means of an additional aperture plate as part of the PD device, with apertures slightly larger than the apertures in plate 203, the stopping plate positioned behind the blanking plate 202', if seen in direction of the incoming beam lb.

In the arrangement of FIG. 8, the correction lens array 205" may be positioned in front of both the aperture and blanking plate 203,202'. In sub-variants of this variant arrangement, the correction lens array may as well be provided between the aperture and blanking plates 203,202' (as in FIG. 6) or after both plates (as in FIG. 7).

The main advantage of arranging the aperture plate 203 in front of the blanking plate 202' is that the irradiation of the aperture plate by radiation (beamlets bm defined by the cover plate 201) is constant and irrespective of the state of deflection of beamlets in the blanking plate 202'. Thus, the control of thermal and other irradiation-caused effects in the aperture plate 203 is easier, even without the provision of an extra stop plate in front of the aperture plate.

Furthermore, due to the comparatively large distance possible between the blanking plate 202' and the stop plate 204, the electrodes 221' need to provide only a small angle of deflection (in the order of a few mrad, e.g. 2 mrad), which allows relaxed requirements on the choice of the width w2' of the openings 220' in the blanking plate and lower voltages with the deflection electrodes 221'.

The plates 22 are held by chucks 23 which are positioned with respect to each other by means of actuators 24,25 realized as piezoactuators or nanopositioning elements of known type. The vertical actuators 25 may also be left off in order to save space; then the positioning between the plates is defined by the height of the chucks 23 themselves which then are simply stacked on each other. One of the chucks, in FIG. 5 for instance the chuck of the aperture plate, may be formed as a cup 233 so as to facilitate lateral positioning of the other chucks. Preferably, the plates 22 and chucks 23 are produced from the same material, e.g. silicon, or materials having the same thermal expansion behavior in the operating temperature range. The chucks also provide for the electric supply of the blanking plate 202 and correction means 205 (if present); for the sake of clarity, the electric lines are not shown in the figures.

In the plates 22 openings 26 are provided for the definition of reference beams rb. The shape of the reference beams rb is defined, for instance, in the opening formed in the aperture plate 203, whereas the corresponding openings in the other plates are wide enough so as to let pass the radiation for the reference beams rb. The reference beams rb and the patterned beam pb are then imaged towards the substrate plane; in contrast to the patterned beam pb, however, the reference beams rb do not reach the substrate 41 but are measured in the alignment system 60 as already mentioned above. The chucks 23 further have alignment openings 236 which serve as alignment markers for relative positioning of the chucks 23 and the plates 22 they hold.

The blanking plate 202 represents the most intricate component of the PD device as it comprises the circuitry of the logic and wiring to control the information fed to the blanking electrodes 221 while the image is passing through the PD device. Instead of positioning the complete logic, suitable miniaturized, between the openings of the blanking plate, the invention proposes to organize the area of the PD field pf into two types of regions: in the regions af ('aperture fields') of the first type, the openings are situated, including the associated electrical feed and shift registers; in the regions sf ('storage fields') of the first type, logic for the control and storage of the blanking openings is accommodated. In the following, with respect to FIGS. 9 to 13, generally the term 'aperture' is used to refer to the blanking openings in the blanking plate 202.

Figure 9:
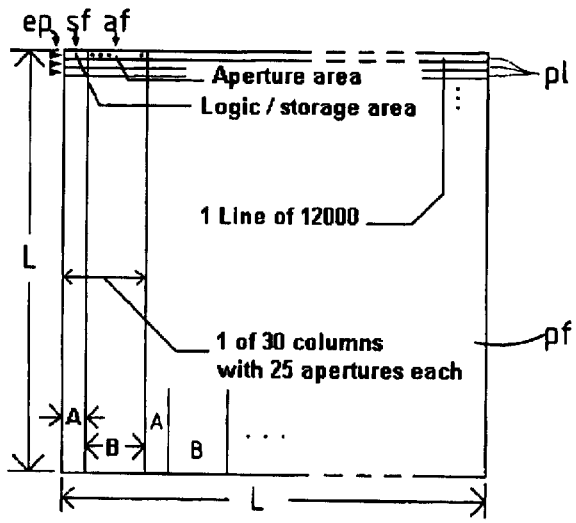
FIG. 9 the layout of a pattern definition field according to the invention.

FIG. 9 shows the layout of the PD field pf according to the invention. The logic circuits needed for control of the blanking openings comprise a considerable amount of storage elements. The task to find a suitable layout for the circuitry is aggravated by the requirement that a number of gray levels between fully switched on and off (i.e., gray levels 0 and 100%) must be realized. This requirements further increases the amount of information to be processed; for instance, for realizing 30 gray levels, an information of at least 5 bits must be processed for each cell (since $30 \leq 2^5 = 32$).

Since it is more space-efficient to arrange such data storage areas in clusters, parts of the BP must be kept free of aperture holes. To this effect, the field pf is segmented into a number of aperture fields af and storage fields sf. In the arrangement of FIG. 9, the field pf is divided into 30 columns, each containing a storage field sf and an aperture field af which span the width L of the PD field along the direction perpendicular to the scan direction. Thus, there are 30 aperture fields and 30 storage fields present, the former covering ¾ of the total area of the PD field pf, the latter covering ¼. The length A of each storage field is 0.5 mm, the length B of each aperture field af is 1.5 mm. Each aperture field af accomodates 750/30 =25 apertures per line. As each of the storage fields sf serves to control the apertures of a respective aperture field af and the data of the pattern to be formed in the BP travels through the fields sf,af along the scanning direction, the logic and aperture fields are preferably arranged alternate.

The layout of the electronic circuitry of the blanking plate (BP) follows the physical layout of the PD field pf closely. There are 12000 lines p1 and 12000 rows, thus forming $144 \cdot 10^6$ cells. As shown in FIG. 2, due to the (n×m)-alignment of apertures in the fields af, only every $12^{th}$ cell in a line p1 has an aperture. Thus, since the aperture fields af cover only ¾ of the area, there are 750 apertures per line p1. The apertures are staggered by three cells between lines (n=3), resulting in a repetitive pattern. The total number of apertures is $9 \cdot 10^6$. Clustered in the vicinity of an aperture is the electronic circuitry controlling that aperture. There are 12000 data lines entering the BP, each passing data from cell to cell. In addition, a comparatively small number of control lines and supply lines are provided.

Due to the nature of maskless lithography large volumes of data must be passed through the BP. In the following it is assumed that the data on each of the 12000 data entry points ep to the BP is furnished and available at a rate of $240 \cdot 10^6$ bits per second.

As the stage carrying the wafer that is to be exposed moves at a constant speed of 1 m/s, which corresponds to 1 nm per ns along the scanning direction sd. Each spot on the wafer, having an area of 25 nm×25 nm, is exposed up to 750 times during one pass of the stage in order to accumulate an ion beam dose sufficient for lithographic purpose, as this is the number of apertures in a scan line. To achieve these subsequent exposures in a single stage movement, the data unit representing a given spot must pass through the BP at a corresponding speed as the stage; stage speed and data speed are equivalent.

As already mentioned every spot shall be exposable in varying degrees of dose, namely 30 gray levels. A data set (defining one spot) therefore is made up of 6 bits, namely 5 bit data as needed to define the gray scale value plus one data bit that is necessary for carrying blanking information along the line. Each data sets enter the BP serially through one of the entry lines ep. Then it must be preserved on its way through the entire BP line, at the end of which it is lost.

There are 12000 data inputs ep to the BP, one for each line p1. In order to describe the data flow, we will consider one data input only in the following. Each data input enters the BP through the side shown left in FIG. 9. One data line associated with an aperture line p1 can functionally be described as a 72000-bit shift register (pseudo shifter). Depending on the data flow direction, data enters the pseudo shifter on one or the other side. Data flow direction follows the direction in which the stage carrying the wafer being exposed moves.

At a data rate of 240 Mbits/sec, the large shift register that constitutes a line, would have to be clocked by a common clock signal, resulting in an unacceptable power dissipation as well as a large lithographic error, should only one of the shift registers cease operation. Additionally, space requirements for such a shift register would not be available within the proposed dimensions.

Every data set, however, must be transported through an entire line p1. It is proposed according to the invention that, since the majority of storage registers needed does not have to move serially, a quasi-static block of registers can be substituted. This block of registers is advantageously accommodated in the storage field associated with the respective apertures.

Every line of apertures on the BP is 12000 cells wide—one cell represents a 25 nm×25 nm spot (area) on the wafer. For each cell, 6 bit of data is required and is shifted along the line. 12000 cells×6 bit=72000 bits per line. This is the storage requirement per line (apart from the flip flops adjacent to the apertures). As seen in FIG. 9, the BP is divided into 30 identical columns, each comprising an aperture field af and a storage field sf; the latter is reserved for storage, emulating a shift-register behavior. In this storage (and logic) area sf there are 10 arrays of dynamic memory-cells for 10 lines, each memory-cell serving the storage requirements of 1/30 of a line, that is 2400 bits. This storage array is repeated on the BP for every line and every column, i.e., 360000 times (=30×12000). Every 2400 bit storage array is addressed in a 60 col/40 row scheme, which is identical for all storage arrays on the BP (see figure C).

Figure 10:
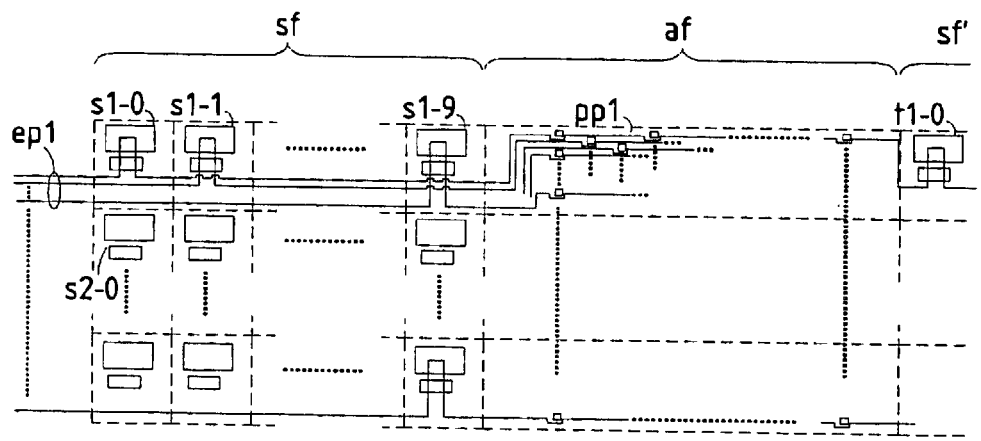
FIG. 10 the arrangement of storage arrays in relation to the aperture lines of FIG. 9.

FIG. 10 illustrates the arrangement of the storage arrays in the storage fields sf in relation to the aperture lines p1. Every logic block s1-0,s1-1, . . . ,s1-9, s2-0, t1-0 has a width of ten lines p1. Therefore, the ten blocks s1-0 . . . s1-9 serving the segments of the ten lines pp1 are positioned in a sequence before the corresponding set of lines pp1. Within the storage column, there are 10 blocks of storage arrays whose physical layout is roughly quadratic, so that they may be addressed with the least number of addresses, each block serving one of ten data lines. Every one of the storage arrays consists of 2400 storage cells (bits of information), since is must serve 400 spot positions at a 6-bit depth (6×400=2400). 400 spot positions×30 columns=12000 spot positions in total per line.

Every line on the BP therefore has assigned 30 storage arrays, each comprising 10 storage arrays shown in FIG. 10.

During every clock cycle (240 MHz) one bit of a storage array is read, in the same operation evaluated by a gray comparator (FIG. 14) and—after evaluation/modification by the gray comparator—stored in the next storage array at the same address. Column/row decoding for the storage arrays is external, not integrated inside the BP boundaries. A free running counter that is synchronized with the 240 MHz system clock is multiplexed and fed to all storage arrays simultaneously via 100 address lines. The counter wraps around after 2400 counts.

With respect to the physical layout of the BP, one major requirement is the efficient usage of available space. Flip flops would have been the obvious choice for the 2400 bit storage arrays; one flip flop however consumes up to 40 times more space than is required by a DRAM cell. Therefore modified DRAM cells are used in the design. These modified DRAM cells differ from normal DRAM's insofar as they have a higher operating speed of 240 MHz, i.e. within one 240 MHz cycle such a cell can be read (with the rising edge) and written (with the trailing edge). One other special attribute of this DRAM cell is that it need not be refreshed as is the case with normal cells, because the information stored in any cell of the storage array has to be kept valid for only about 10 $\mu$sec, that is the time the address selection takes to wrap around. To the controlling electronic circuitry, the 2400 bit storage array behaves like an ordinary memory array by use of read/write amplifiers, which transform the weak analog signals to common logic voltage levels.

Figure 11:
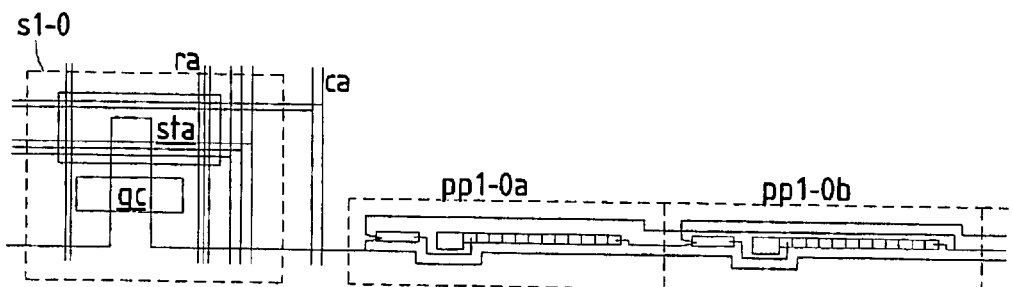
FIG. 11 a functional overview of the logic of FIG. 10.

The block diagram of FIG. 11 shows the function of one storage field sf and the associated aperture field af with respect to one line p1. The layout of this circuitry is shown in FIG. 12.

The logic circuit s1-0 is shown to the left, feeding the circuits pp1-0a,pp1-0b, . . . of the apertures of this line. During one clock cycle of the 240 MHz system clock ck one bit of data passes from one storage array s1-0 to the next. The address of the storage cell in the storage array is selected by a free running address decoder rcd, external to the BP, addressing the individual storage cell within the storage array s1-0 through a row/column addressing scheme of known type, comprising 60 column-select lines ca and 40 row-select lines ra. The address wraps around at 2400 and is the same for all storage arrays in the entire system.

As a new data bit enters a line through the serial line es0, it is (1) stored in the storage array sta into the storage location as addressed by the decode rcd, while the bit which has been stored in that location before is (2) read out and submitted to the gray comparator go for evaluation. The output of the gray comparator is connected to two points, the first at 240 MHz data rate leads to the next storage array (input line et0 of the next logic circuit s1-1), the other branches off to the circuitry pp1-0a of an aperture. This is the first of 25 consecutive aperture circuits pp1-0a, pp1-0b, . . . , which each contain a 12-stage shift registers (FIG. 12). Since these registers get clocked at ⅙ of the system clock speed (=40 MHz), only every 6$^{th}$ bit of the data present at the input et0 is clocked in. That bit carries the blanking information for the apertures (Blanking Signal). One plate of an aperture is connected to every first shift register in the group of 25 (see FIG. 13). Blanking information passes through these shift registers at the same rate as that of the wafer movement. After 300 shift registers, a bit is shifted out the last register and lost.

Figure 12:
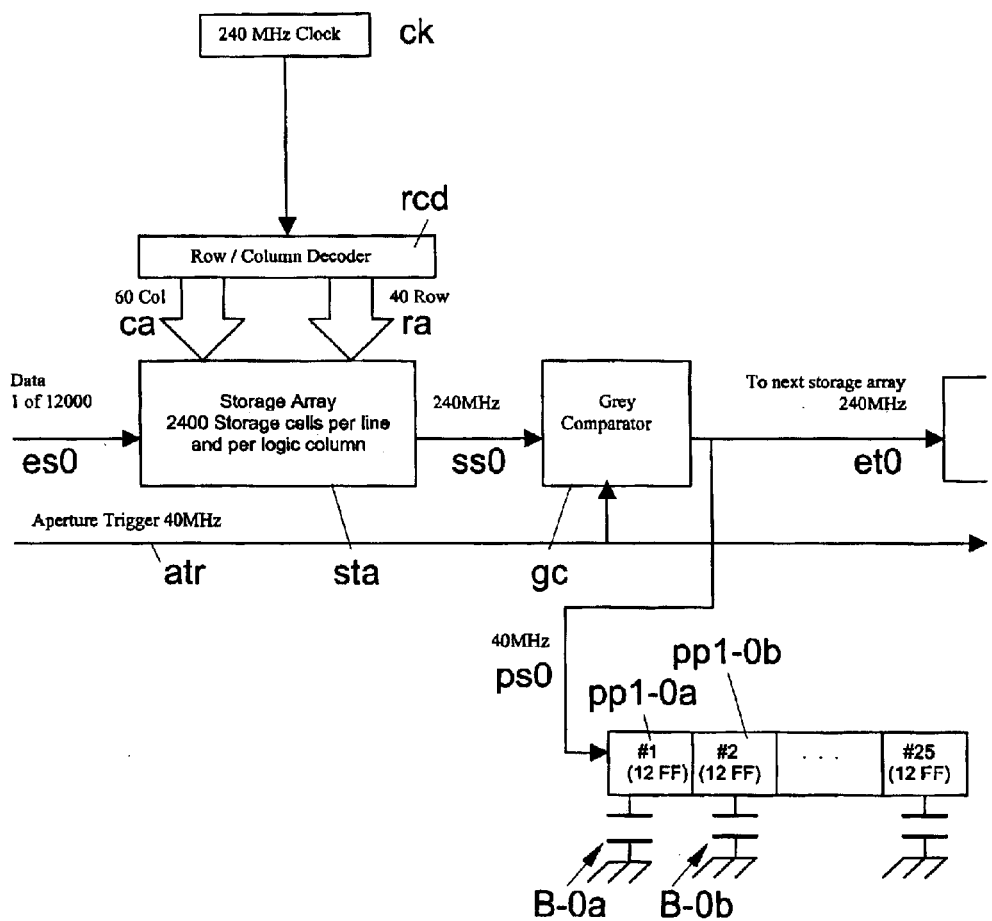
FIG. 12 the arrangement of FIG. 10 with regard to a single aperture line.

In FIG. 12 the following signals are shown: The clock signal ck is the master clock that maintains the process of shifting data through the BP. It is a 240 MHz 50% duty cycle square wave. The aperture trigger signal atr is derived from the clock signal ck. After every 6 full cycles of the signal ck, the aperture trigger signal atr follows the positive half-wave of the signal ck for one cycle. This signal is used to change the state of the aperture and then keep that state for the duration of one spot exposure duration. Aperture Trigger atr is generated external to the BP and is synchronous throughout the system.

Figures 13, 13A:
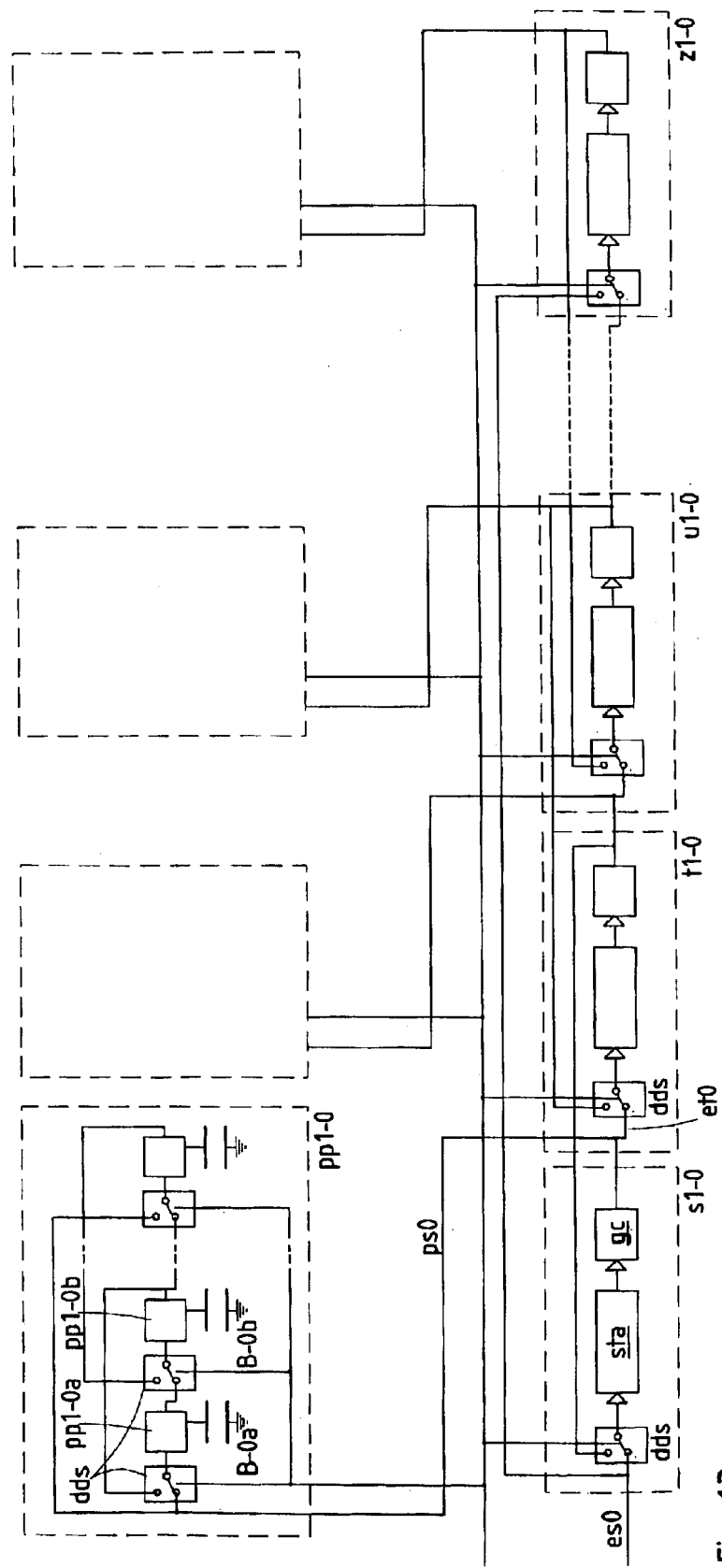
FIG. 13 the data direction control.

A further signal ddr ('data dir control') allows selection of the direction that data is passed through the shift array; this is illustrated in FIG. 13. The signal ddr is used to define the direction in which data travels through the BP, according to the direction of the stage (from left to right or from right to left in FIG. 4). It remains in either logical state for the duration of a complete stage pass across a wafer. The signal ddr controls the flow direction by means of switches dds which are connected to the input of each logic block. The two inputs i1,i2 of each switch dds are fed the outputs of the two neighboring blocks, respectively, and of these two inputs i1,i2 one is chosen to be led to the output os of the switch according to the data direction as specified by the ddr signal. One possible realization of a switch dds is shown in the insert of FIG. 13a. (The data direction control wiring is not shown in FIGS. 10, 12 and 14 for clarity.)

As to the data line es0/et0, there are 12000 data lines, one for each aperture line p1. They pass serial data fed into the BP to the first aperture logic in the BP, or to the last one, depending on the state of the Data Dir Control signal ddr. Every data line is confined to one only line of the BP, respectively, and does not trespass into other lines. The data is 6 bits serial and enters the system with the LSB of the gray scale first.

Figure 14:
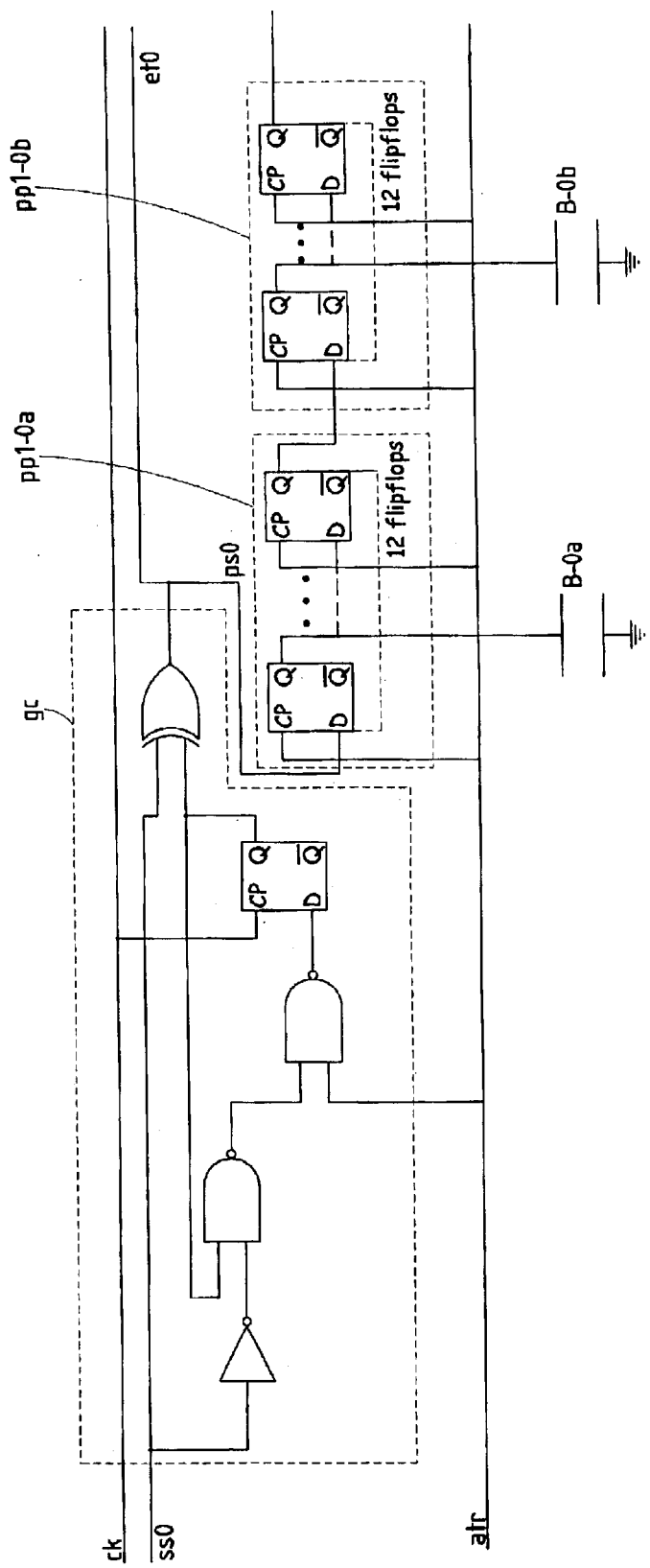
FIG. 14 the gray comparator circuit used in the layout of FIG. 10.

FIG. 14 illustrates the gray comparator gc. The gray comparator is realized as a serial decrementor. This decrementor works as a 6-bit decrementor as it is triggered by the clock signal ck and reset by the signal atr which is active every $6^{th}$ clock period. Thus, data fed via the ss0 line enters into the gray comparator gc in 6-bit data blocks, 5 of which are gray-scale information (LSBit first) and the $6^{th}$ bit is the 'blanking bit', which is initially zero. The gray comparator gc is part of every aperture logic column (FIG. 12), thus there is one gray comparator per column and per line, i.e. 30×12000=360000 for the whole plate. Also shown in FIG. 14 are the shift register lines associated with the apertures. Each of the shift register lines comprises 12 D-registers, of which the first register is used to actually activate the respective aperture blanking electrodes B-0a,B-0b, . . . .

To understand the function of the gray comparator gc it is necessary to refer again to the physical layout of the plate. For simplicity we will consider one of the 12000 lines only: Each line is subdivided into 30 segments (with 25 apertures each, cf. FIG. 9; every segment is that part of the line which falls into one aperture field af). Each segment is associated with one of the 30 gray-values. The first segment has the task to open its apertures if the gray-value is greater than 0. The second segment has the task to open when the gray-value is greater than 1, etc. To achieve this functionality with minimal logic, the gray comparator gc at the entry point to the first segement checks if the received gray-value is greater than zero, by decrementing the gray-value (by one). The decremented gray-value exits the gray comparator gc and is passed on to the next segment. The gray comparator also generates a blanking signal bs which is updated every $6^{th}$ clock cycle. This blanking signal bs passes from aperture to aperture at a 40 MHz rate. When the gray comparator has counted down to zero, an overflow occurs and the $6^{th}$ bit, namely the blanking bit, gets set. The next segment detects the blanking bit and inhibits opening of the following apertures. Thus, a 5-bit gray-scale information is decremented at every segment; the associated apertures open only as long as the gray-scale information is greater zero.

Another variant of the invention illustrated in FIGS. 15 to 21 uses another alignment scheme according to n×m=2×2=4, as well as a different method of producing gray scales as discussed below. This variant may be implemented as an alternative or in combination with the above-discussed embodiment.

FIG. 15, in a manner analogous to FIG. 2, shows a plan view of a PD arrangement of apertures according to this variant embodiment of the invention. A plurality of square-shaped apertures 21' is provided which are arranged in an aperture field af in a regular array formed by a sequence of rows rr. In this case, the apertures of every second row align (n=2) as the pitch pn' between neighboring rows is twice the width w' of an aperture (i.e., pn'=2w'), and the offset pm' between neighboring rows the doubled width of an aperture (i.e., pm'=2w with m=2). Thus, the apertures cover 1/(n×m)=¼ of the area of the aperture field af and, at a time, only one out of n×m=4 image elements can be exposed as shown in corresponding FIG. 16; the other elements are exposed in subsequent steps by means of moving the substrate along the "scanning direction" sd relative to the image of the apertures.

FIG. 16 illustrates the image field mf' produced on the substrate by means of the aperture arrangement of FIG. 15. The discussion of FIG. 3 applies to FIG. 16 in an analogous manner; FIG. 16a illustrates the exposure of pixels in subsequent n×m=4 positions of the motion of the substrate wherein the pixels are accordingly referenced with letters a to d (the pixels shown hatched are position a). In other respects, the remarks to the arrangement of FIGS. 2 and 3 apply to this arrangement of FIGS. 15 and 16 in an analogous manner; in particular, a storage field sf (though not shown in FIG. 15) my be present as well.

Figure 17:
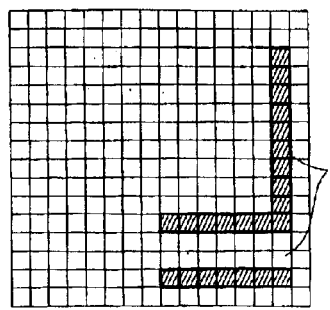
FIG. 17 a layout of a simple example pattern which is produced on a sub-region of the target field on the substrate surface with the arrangement of FIG. 15.

FIG. 17 shows an example of a pattern ml that is to be imaged on a subfield of the target field located on the substrate; as will be discussed below with reference to FIG. 21 below, the pattern m1 represents a fraction of the image field mf' and has a size of 16×16 pixels. The example pattern is composed of two lines pt which are exposed by switching on the corresponding apertures. The diagrams of FIGS. 18a to 18d show the imaged patterns C1 that are produced at the target field one after the other, in order to generate the pattern mf of FIG. 17. Pixels exposed through fully transparent apertures are referenced A1, whereas A0 denotes an opaque (non-transparent) aperture, i.e., a pixel receiving no exposure.

The aperture patterns C1 are determined from the pattern m1 according to the different positions of the apertures during the movement of the substrate. In FIGS. 18a to 18d, this movement appears as a movement of the apertures (as denoted by the small curved arrows connecting corresponding rows in the frames of FIGS. 18a–18d) through the target field frames defined on the (moving) substrate; it is to be noted that in fact, it is the apertures that are kept fixed in the lithography apparatus and the substrate is moved by means of the wafer stage 40. Furthermore, when the movement goes on after the diagram of FIG. 18d, a pattern is used as a next aperture pattern which corresponds to that of FIG. 18a, but is shifted to the left by one set of n rows along the scanning direction. This measure of shifting the pattern through the apertures along the aperture lines ensures that generation of the pattern m1 can continue over a line of apertures during the movement of the substrate. The patterns as shown in FIG. 18 are fed to the PD device using a controller computer (not shown) which splits the desired pattern m1 into an appropriate set of aperture patterns C1.

From the above, it becomes clear that a pixel on the substrate surface can be exposed through a number of apertures, namely those apertures which form a line along the scanning direction. Thus, one pixel can receive more than one single dose $Q_A = I_A \cdot t_A$ that passes through one switched-on aperture during the single exposure duration $t_A$; $t_A$ is the duration of exposure of one pixel A1, or equivalently, the time allotted to one frame C1. Thus a pixel can be exposed a maximum dose of $k \cdot Q_A$ where k is the number of apertures in a line; in the example illustrated in the drawings, one pixel can receive a dose of up to $4Q_A$. Thus, the single dose $Q_A$ can be chosen lower than the threshold of development of the substrate (for instance, the photoresist) at the place of a specific pixel, provided the maximum dose $kQ_A$ is higher than the threshold. This helps to reduce the time of exposure in the lithography apparatus which in turn enhances the throughput of the system.

For shifting the patterns as illustrated in FIG. 18 through the apertures of the PD device, shift registers are provided in a blanking means of the PD device as proposed by Berry et al. (op. cit.). According to the Berry et al. layout, for each aperture (n×m) shift registers are present which are cycled with a frequency $1/t_A$. This layout is modified according to the invention as described below in order to reduce lens aberrations due to a varying current of the patterned beam pb.

From FIG. 18 it becomes obvious that the aperture patterns C1 change from frame to frame, and the total current which passes through the PD device can vary strongly. For instance, in FIG. 18a the total current is 8 $I_A \approx 280$ nA; in FIG. 18b the total current is 3 $I_A$, in FIG. 18c 9 $I_A$, and in FIG. 18d again 3 $I_A$. Such a variation of the total current through the optical system will cause problems as the spatial charge effects and Coulomb repulsion, which influence the focusing properties of the optical system, will vary heavily during time upon switching from one frame of FIG. 18 to the next.

Figure 19:
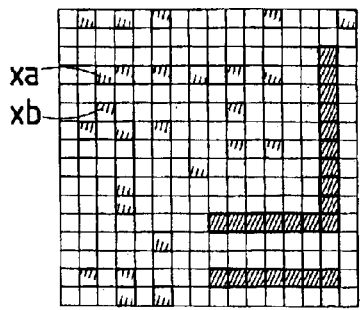
FIG. 19 the exposure pattern produced on the target field of FIG. 17 according to the invention.
Figure 18A:
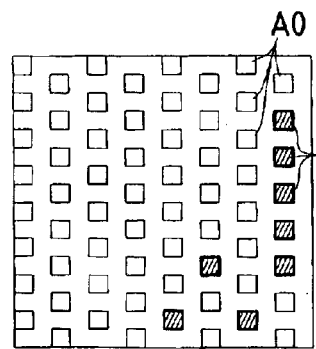
FIGS. 18a–18d a sequence of four aperture patterns into which the pattern of FIG. 17 is divided.
Figure 20A:
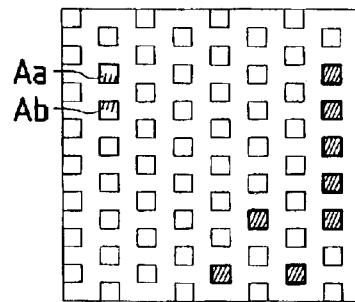
FIGS. 20a–20d a sequence of four aperture patterns used to produce the patterns of FIGS. 17 and 19.
Figure 18B:
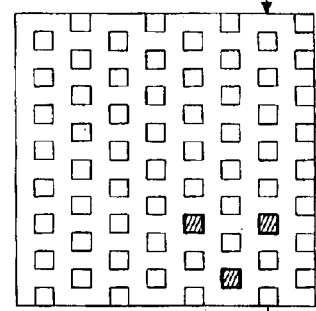
Figure 20B:
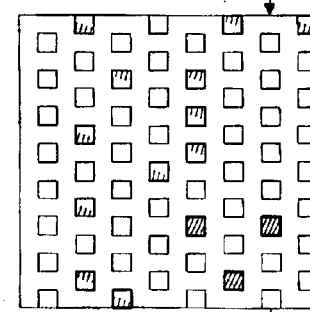
Figure 18C:
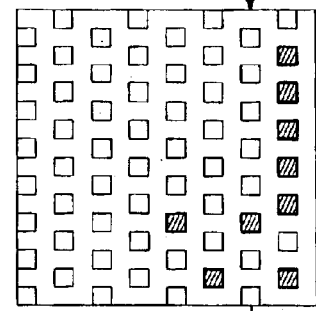
Figure 20C:
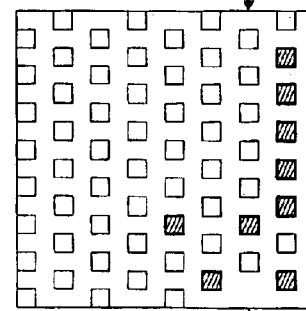
Figure 18D:
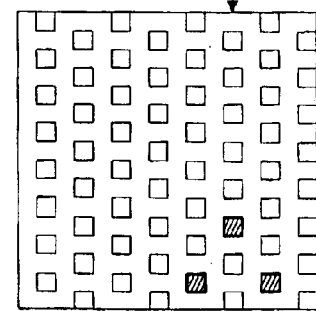
Figure 20D:
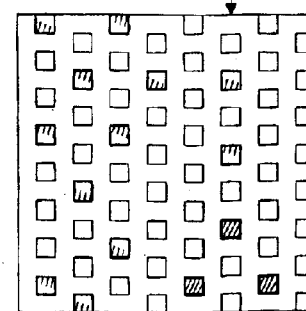

According to the invention, a uniform current density is maintained by adding some current through suitably selected apertures, as denoted by partial hatching (reference symbols Aa, Ab) in FIG. 20. This is done by adding a fraction of the full pixel dose to a suitable number of pixels in each frame, wherein this fraction is below the threshold of development of the photoresist. In the example of FIGS. 20a–20d, the patterns of FIGS. 18a–18d are modified so as to have a uniform total current of 9 $I_A$ (FIG. 6c) as this is the maximum level of current in the basis patterns of FIGS. 6a–6d. Assuming a development threshold of, e.g., 3 $Q_A = 4 t_A \times 0.75 I_A$, pixels with a half pixel dose 0.5 $Q_A = 0.5 t_A \times I_A$ are added patterns in FIGS. 20a–20d. FIG. 19 shows the resulting exposure pattern mp in the target field subregion, where pixels xa,xb that receive a sub-threshold exposure are denoted by partial hatching.

The fraction of additional pixel dose is, in general, a number between 0 and 1 and is chosen suitably below the development threshold of the photoresist (in general, of the substrate to be exposed). Preferably, inverse of integer numbers are used, i.e., ½,⅓,¼ and so on.

The additional current is realized by switching on the corresponding apertures during a fraction of the time $t_A$. Here, the corresponding apertures Aa,Ab are those apertures used to expose the pixel xa,xb in question, with regard to the periods where the pixel is actually exposed through the apertures. For instance, for a transparency of ½ (or, more generally, 1/p) pixels of two (p) types are chosen. During the time of exposure of a pixel xa, the respective aperture Aa is switched on for the first half (the first p-th part) of the duration of the exposure time $t_A$ while for the other half (the remaining part) it is switched off. For the second pixel type xb the matching aperture Ab is switched on only for the second half (the second p-th part) of the exposure time $t_A$. In the case of fractions lower than ½, further pixel types are introduced for the remaining parts of exposure (third p-th part and so on). This measure of switching on apertures only for a half (1/p) fraction of exposure time can be realized by doubling (multiplying by a factor p) the number of the shift registers provided with the apertures in the blanking means of the PD device. In order to keep the motion of the substrate consistent with the motion of the pattern as it is shifted through the blanking means (more accurately, through the shift registers), either the clock frequency of the shift registers is doubled to $2/t_A$ (or $p/t_A$) or the motion of the substrate is slowed down by a factor of 2 (or in general, p). An alternative way to achieve fractional exposure doses would be a grey scale coding of the image. The grey scale pixels, e.g. 5 bit grey scales (=32 levels), could be shifted through the blanking means by means of 5×(n×m) bit shift registers.

Figure 21:
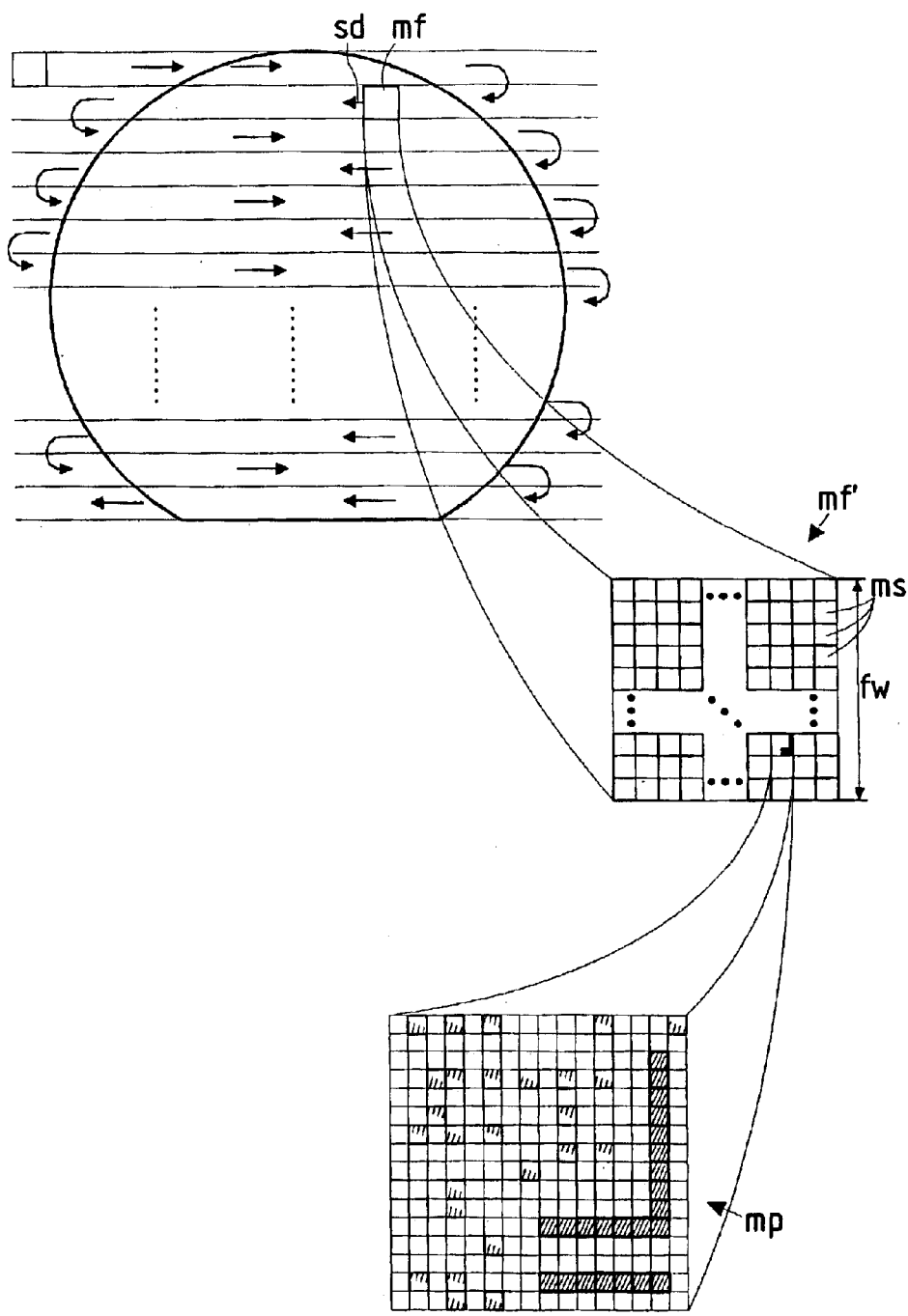
FIG. 21 illustrates the relation between the image field of FIG. 4 and the subfield corresponding to the example pattern of FIGS. 17–20.

The procedure for homogenizing the current level as explained above with reference to FIGS. 17–20 can be done at once for the total image field; preferably, however, it is done for each of a plurality of sub-fields ms into which the image field mf is divided, as illustrated in FIG. 21.

For instance, the image field mf is divided into a regular array of subfields ms having a uniform size of, e.g., 16×16 pixels like in FIGS. 17–20; one of the subfields ms is the subfield m1,mp shown in FIGS. 17–20. Of course, other suitable sizes can be chosen as well, preferably a suitable submultiple of the total pixel number along each dimension. The number of sub-fields is determined by the ratio of the size of the image fields mf to the subfields ms. In the present example, the number of sub-fields is (12000/16)×(12000/16)=750×750=562500. The subfield is usually chosen quadratic, but in general can have another suitable shape as well. To avoid that the pattern density inside a subfield is too high, in practice it will be convenient to choose much greater subfields than shown in FIGS. 17–20, as for example subfields with a total pixel number of 12000/16=750 along each dimension, and the number of sub-fields being 256.

When the subfields ms are defined, the above-defined current homogenizing procedure is done for each pattern (FIG. 17) in a sub-field. First, a uniform set current level is chosen, for example by determining the maximum value of the currents that can occur within a sub-field. Then for each sub-field ms the current is adjusted to the set current level by adding fractional pixels as explained above. Thus the space charge density of the patterned beam is rendered sufficiently homogeneous so as to suppress the associated imaging aberrations substantially. It should be mentioned that it is sufficient to determine a uniform set current level for each scan line, as the current may vary for different scan lines.

We claim:

1. A device for defining a pattern, for use in a particle-beam exposure apparatus, said device adapted to be irradiated with a beam of electrically charged particles and allow passage of the beam only through a plurality of apertures, said device comprising:

an aperture array having a plurality of apertures of identical shape defining the shape of beamlets permeating said apertures; and a blanking means for switching off the passage of selected beamlets, said blanking means having a plurality of openings, each opening corresponding to a respective aperture of the aperture array and being provided with a controllable deflection means for deflecting particles radiated through the opening off their path to an absorbing surface within said exposure apparatus, wherein the apertures and corresponding openings are arranged on the blanking means and the aperture array within a pattern definition field being composed of a plurality of staggered lines of apertures, and wherein each of the lines is segmented into at least one first segment which is free of apertures and at least one second segment which comprises a number of apertures disposed next to each other by a row offset which is a multiple of the width of apertures, the length of said first segment being greater than the row offset.

2. The device of claim 1, wherein the apertures are arranged in the pattern definition field in a regular array which, perpendicular to the direction of the lines, repeats itself every n-th line, where $n \geq 2$.

3. The device of claim 2, wherein n=3, 4 or 5.

4. The device of claim 1, wherein the first segments of the lines are positioned adjacent to each other and form one or more storage fields spanning the width of the pattern definition field.

5. The device of claim 4, wherein the lines are grouped into a plurality of groups and the first segments in each group are divided along the direction of the lines into logic blocks, each of the logic blocks comprising a controlling logic for the second segment in the respective line of the group situated by the first segment.

6. The device of claim 1, wherein the blanking means comprises storage means for buffering information to control the deflection means associated with the apertures, said storage means being located in the first segment.

7. The device of claim 1, further comprising a cover positioned in front of the blanking means as seen in the direction of the particle beam, the cover comprising a plurality of openings, each opening corresponding to a respective opening of the blanking means and having a width smaller than the width of the opening of the blanking means.

8. The device of claim 7, wherein the aperture array is positioned after the blanking means as seen in the direction of the particle beam.

9. The device of claim 8, wherein the cover is realized as a unit other than the blanking means.

10. The device of claim 8, wherein the absorbing surface is realized by a surface of the aperture array.

11. The device of claim 8, wherein the aperture array comprises an aperture plate of varying thickness adapted to act as correction lenses with a varying correction strength upon receiving beamlets defined by the apertures.

12. The device of claim 8, wherein the aperture array comprises an aperture plate in which an opening space is provided after each aperture, said opening spaces adapted to act as correction lenses upon receiving the respective beamlets defined by the respective apertures, said opening space further having a varying width defining a varying correction lens strength upon receiving beamlets defined by the apertures.

13. The device of claim 7, wherein the aperture array is positioned in front of the blanking means as seen in the direction of the particle beam, and the absorbing surface is realized by a stop plate positioned in the exposure apparatus after the device.

14. The device of claim 13, wherein the cover is realized as a unit other than the aperture array.

15. The device of claim 7, further comprising a correction lens positioned after the blanking means, said correction lens comprising an array of electrostatic lenses, each of said lenses acting on a beamlet projected through an opening of the cover means.

16. The device of claim 15, wherein the correction lens is positioned after both the blanking means and the aperture array.

17. A method for forming a pattern on a surface of a substrate by means of a beam of electrically charged particles, comprising:

producing said particle beam;

directing said particle beam through a pattern definition means and producing a number of beamlets using an aperture array of the pattern defining means having a plurality of regularly arranged apertures of identical shape defining the shape of said beamlets, and using a blanking means of the pattern defining means to switch off the passage of selected beamlets, the others forming, as a whole, a patterned particle beam;

projecting said patterned particle beam onto said substrate surface to form an image of those apertures which are switched on, each aperture corresponding to an image element on the substrate surface during a uniform exposure time; and providing a relative motion between the substrate and the patterned particle beam according to the movement of the beamlets over a sequence of adjacent image elements on the substrate surface, resulting in an effective motion of the patterned particle beam over the substrate surface and exposing different image elements at different exposure times, wherein, in the aperture array, the apertures are arranged in aperture fields whose area is covered by the apertures only to a fraction 1/N, where N is an integer of at least 4, and wherein a subset of the apertures is switched on during a fraction of the exposure time and switched off for the remaining fraction of the exposure time, and the total time of exposure of image elements corresponding to said apertures causes an exposure dose of said image elements to be lower than a threshold value of development, said threshold value being lower than or equal to the value corresponding to a full exposure as caused by an aperture switched on during the full exposure time.

18. The method of claim 17, wherein the number of switched-on apertures is kept constant during each fraction of exposure time.

19. The method of claim 17, wherein the plurality of apertures is divided into groups according to a division of the area occupied by the apertures into a multitude of sub-fields, and within each group of apertures corresponding to a sub-field the number of switched-on apertures is kept constant at a set level, which set level is uniform over said groups.

20. The method of claim 17, wherein the image elements exposed in N subsequent positions of the patterned particle beam form a contiguous covering of a target field on the substrate.

21. The method of claim 20, wherein the position of the image is adjusted by means of a deflection system according to a saw-tooth-like motion, the position of the image being adjusted wherein during the continuous slopes of the saw-tooth in a manner to hold its position relative to the substrate surface on a position of a respective target field on the substrate.

* * * * *

UNITED STATES PATENT AND TRADEMARK OFFICE
CERTIFICATE OF CORRECTION

PATENT NO. : 6,768,125 B2
DATED : July 27, 2004
INVENTOR(S) : Elmar Platzgummer et al.

It is certified that error appears in the above-identified patent and that said Letters Patent is hereby corrected as shown below:

<u>Title page,</u>
Item [30], Foreign Application Priority Data, "(AU)" (both occurrences) should read -- (AT) --; and "A 434/202" should read -- A 434/2002 --.

Signed and Sealed this

Seventh Day of December, 2004

JON W. DUDAS
*Director of the United States Patent and Trademark Office*